United States Patent
Grötsch et al.

(10) Patent No.: US 7,621,658 B2
(45) Date of Patent: Nov. 24, 2009

(54) LIGHT-EMITTING MODULE

(75) Inventors: Stefan Grötsch, Lengfeld/Bad Abbach (DE); Moritz Engl, Regensburg (DE); Florin Oswald, Regensburg (DE); Michael Sailer, Pentling (DE); Alexander Wilm, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 11/853,129

(22) Filed: Sep. 11, 2007

(65) Prior Publication Data

US 2008/0151547 A1 Jun. 26, 2008

Related U.S. Application Data

(63) Continuation of application No. PCT/DE2006/000362, filed on Feb. 28, 2006.

(30) Foreign Application Priority Data

Mar. 16, 2005 (DE) .................. 10 2005 012 486
Jul. 19, 2005 (DE) .................. 10 2005 033 709

(51) Int. Cl.
*F21V 5/00* (2006.01)
(52) U.S. Cl. .................. 362/336; 362/353; 362/340
(58) Field of Classification Search .................. 362/340, 362/338, 335–336, 317, 353
See application file for complete search history.

(56) References Cited

U.S. PATENT DOCUMENTS

| | | | | |
|---|---|---|---|---|
| 4,224,971 A | * | 9/1980 | Muller et al. .................. 411/15 |
| 5,632,551 A | * | 5/1997 | Roney et al. .................. 362/485 |
| 6,906,459 B2 | * | 6/2005 | Suehiro et al. .................. 313/512 |
| 2003/0007359 A1 | * | 1/2003 | Sugawara et al. .................. 362/326 |
| 2003/0156416 A1 | * | 8/2003 | Stopa et al. .................. 362/294 |
| 2004/0145821 A1 | | 7/2004 | Hergenhan |
| 2004/0183081 A1 | | 9/2004 | Shishov et al. |

FOREIGN PATENT DOCUMENTS

| | | |
|---|---|---|
| DE | 10 2004 004 778 | 9/2005 |
| EP | 1 383 175 | 1/2004 |
| EP | 1 519 107 | 3/2005 |
| GB | 2 391 702 | 2/2004 |
| JP | 2004293211 | * 10/2004 |
| WO | WO 03/048637 | 6/2003 |
| WO | WO03048637 | * 6/2003 |
| WO | WO 2006/021179 | 3/2006 |
| WO | WO 2006/045277 | 5/2006 |

OTHER PUBLICATIONS

International Search Report and Written Opinion of International Application No. PCT/DE2006/000362 by Examiner E. Berthomme dated Jun. 27, 2006.
I. Schnitzer et al., "30% external quantum efficiency from surface textured, thin-film light-emitting diodes", Appl. Phys. Lett. vol. 63, No. 16, pp. 2174-2176 (Oct. 18, 1993).

* cited by examiner

*Primary Examiner*—Jacob Y Choi
*Assistant Examiner*—Julie A Shallenberger
(74) *Attorney, Agent, or Firm*—Fish & Richardson P.C.

(57) ABSTRACT

A light-emitting module is specified that comprises a light source, a carrier for said light source, and an optical element, wherein the optical element comprises dowel pins that engage in corresponding recesses in the carrier. The light-emitting module is particularly well suited for use in optical projection apparatuses and in motor vehicle projection lamps.

23 Claims, 21 Drawing Sheets

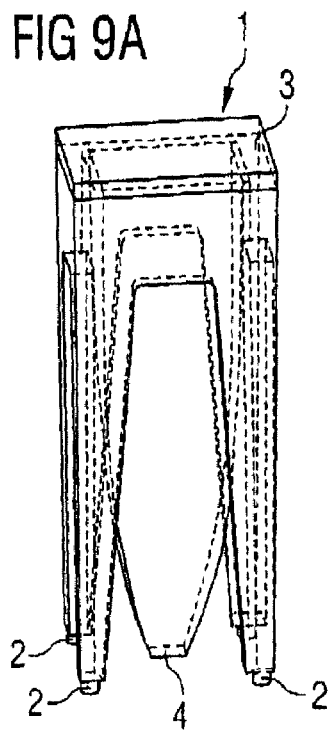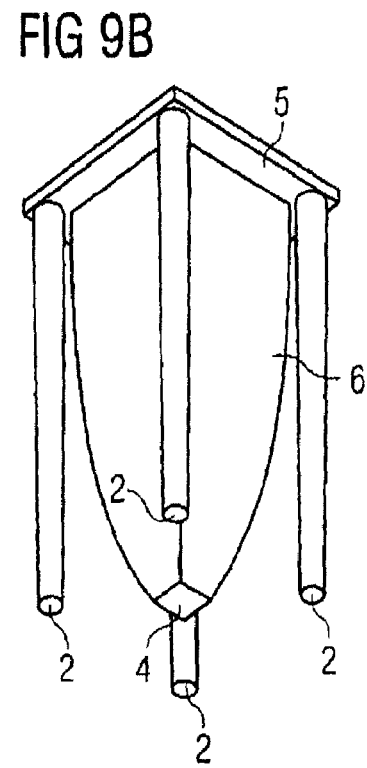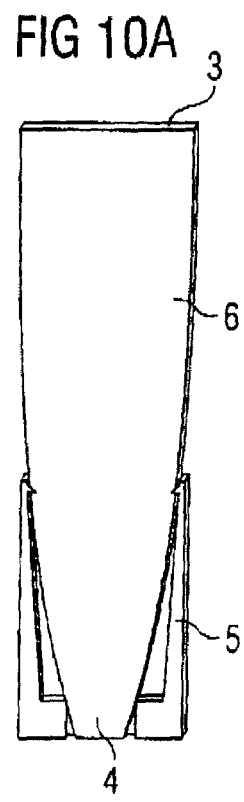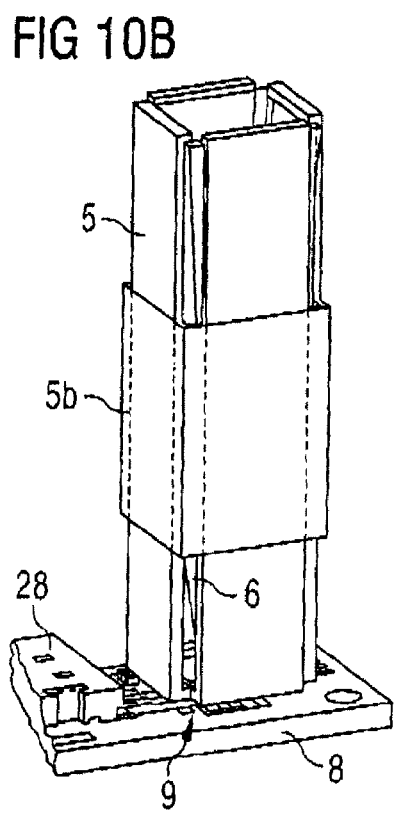

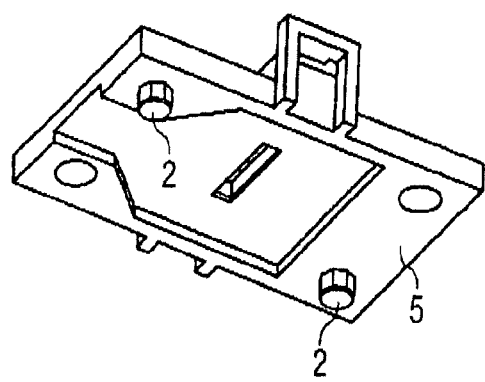
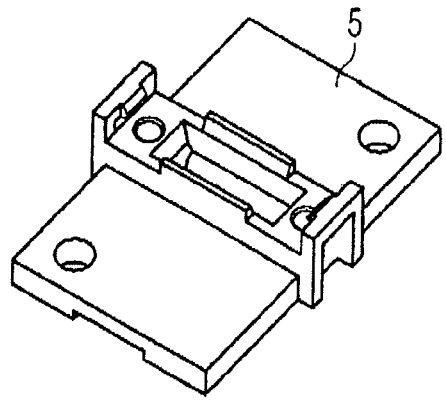
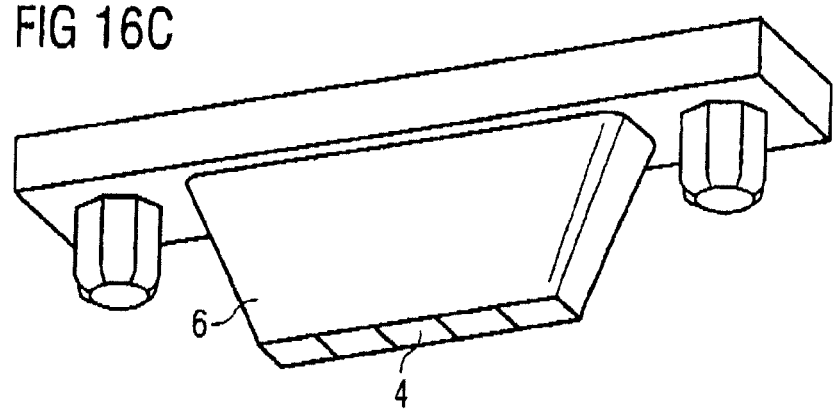

LIGHT-EMITTING MODULE

CROSS REFERENCE TO RELATED APPLICATIONS

This application is a continuation of and claims the benefit of priority of International Application No. PCT/DE2006/000362, filed Feb. 28, 2006, which claims priority to German Patent Application Serial No. 10 2005 012 486.0, filed Mar. 16, 2005, and German Patent Application Serial No. 10 2005 033 709.0, filed Jul. 19, 2005. The contents of the prior applications are hereby incorporated by reference in their entirety.

FIELD OF INVENTION

The invention relates to a light-emitting module.

BACKGROUND OF THE INVENTION

One object is to specify a light-emitting module that is particularly easy to manufacture.

SUMMARY OF THE INVENTION

According to at least one embodiment of the light-emitting module, the light-emitting module comprises a light source mounted on a carrier. Said light source can be, for example, one or more light-emitting diode (LED) chips.

The carrier has, for example, contact points and conductive traces for electrically contacting the light source. In addition, the carrier is preferably suitable for dissipating heat produced during the operation of the light source. The carrier therefore preferably has good thermal conductivity. For example, the carrier is a printed circuit board (PCB) or a metal-core board.

According to at least one embodiment of the light-emitting module, the module comprises an optical element with dowel pins. That is, at least one dowel pin is mounted on the optical element or the optical element is integrally configured with at least one dowel pin. The dowel pins of the optical element preferably engage in corresponding recesses in the carrier. That is, the carrier has recesses—e.g., bores—in which the dowel pins of the optical element can engage. The optical element is then preferably arranged on the carrier such that at least a portion of the electromagnetic radiation generated by the light source when in operation passes through the optical element and is optically influenced thereby.

According to at least one embodiment of the light-emitting module, the light-emitting module contains a light source, a carrier for the light source, and an optical element, wherein the optical element comprises dowel pins that engage in the corresponding recesses in the carrier.

According to at least one embodiment of the light-emitting module, the dowel pins are provided for aligning the optical element on the carrier. That is, the dowel pins act as alignment pins, by means of which the optical element can be aligned relative to the light source. The optical element is, for example, centered relative to the light source. Preferably, the shape, size and arrangement of the recesses in the carrier and the shape, size and arrangement of the dowel pins of the optical element are calibrated to one another such that precise alignment of the optical element relative to the light source is effected merely by inserting or pressing the dowel pins into the recesses.

This configuration of the light-emitting module makes it possible to mount the optical element on a carrier with little technical expenditure and high precision. Mechanical connection between the optical element and the carrier can be mediated for example by means of an adhesive, such as a glue, which is disposed between the optical element and the carrier.

According to at least one embodiment of the light-emitting module, the dowel pins mediate a mechanical connection between the optical element and the carrier. This can be achieved, for example, by press-fitting the dowel pins of the optical element into the recesses in the carrier. In this case, the lateral extent of the recess—i.e., for example, the diameter of the recess—is selected to be just slightly smaller than the lateral extent—for example, the diameter—of the dowel pin. Mechanically pressing the dowel pins into the corresponding recesses in the carrier then creates a mechanically firm connection between the optical element and the carrier. In addition, an adhesive, for example, can further be provided between the optical element and the carrier to additionally mediate a mechanical connection between these two elements of the light-emitting module.

According to at least one embodiment of the light-emitting module, the dowel pins of the optical element are provided for aligning the light-emitting module. To this end, the dowel pins are preferably configured as sufficiently long that they project through the recess in the carrier to the opposite side of the carrier from the optical element. In this way, the dowel pins of the optical element are able to function as dowel pins for the entire module. The module can then, for example, be aligned relative to a module holder.

The module holder can be, for example, a heat sink that can also include cooling fins. On at least one of its surface[s] provided for mounting the light-emitting module, the module holder has recesses in which the dowel pins of the optical element engage. An adhesive can be disposed between the light-emitting module and the module holder to mechanically attach the light-emitting module to the module holder. It is also possible, however, for the light-emitting module to be attached to the module holder by means of at least one screw.

By precisely aligning the light-emitting module relative to a module holder, it is also possible simultaneously to align the light-emitting module relative to a further optical element that can be connected to the module holder.

According to at least one embodiment of the light-emitting module, the dowel pins are provided for mechanically attaching the module. That is, the dowel pins project through the recesses in the carrier to the opposite side of the carrier from the optical element. The light-emitting module is then placed on a module holder having recesses that correspond to the dowel pins and in which the dowel pins engage. In this case, the lateral extent of the recess and that of the dowel pin are adapted to each other such that by pressing the light-emitting module against the module holder, a mechanically firm connection is created between the module holder and the light-emitting module. That is, the light-emitting module can be connected to the module holder via the dowel pins by press-fitting. Furthermore, it is possible for the light-emitting module to be attached to the module holder additionally by means of a bonding agent, such as a glue, for example, or by means of at least one screw.

According to at least one embodiment of the light-emitting module, the dowel pins of the optical element are further suitable for aligning a further optical element that is disposed after the module. Said further optical element can be a secondary optic, such as, for example, a projection lens. At least a portion of the radiation that passes through the optical element of the light-emitting module then subsequently passes through the secondary optic and is optically influenced thereby.

In this embodiment, the optical element of the light-emitting module preferably comprises at least one dowel pin, which extends in the direction of the secondary optic—i.e., away from the carrier, for example. The secondary optic then has a corresponding recess in which the dowel pin can engage. The dowel pin can in this case also extend both in the direction of the carrier and in the direction of the secondary optic, so that the same dowel pin serves both to align the optical element relative to the carrier and to align the secondary optic relative to the light-emitting module. It is also possible, however, for the optical element to comprise dowel pins suitable for aligning the optical element and other dowel pins provided for aligning the secondary optic.

According to at least one embodiment of the light-emitting module, dowel pins of the optical element are provided for mechanically attaching the further optical element. This can be effected, for example, via a press fit, as described earlier hereinabove.

According to at least one embodiment of the light-emitting module, further dowel pins are provided for mounting the light-emitting module on a module holder, for example a heat sink, and/or dowel pins for mounting an optic body of the optical element in a holder of the optical element. Moreover, these dowel pins can be provided separately, they can be formed onto the optical element, the optic body or the holder, or alternatively they can coincide with the above-described dowel pins of the optical element.

The described light-emitting module as a whole makes use of the idea, inter alia, that especially precise alignment of the optical element relative to a light source can be achieved by means of dowel pins that are mounted on the optical element or integrally configured therewith. It is further possible to use the same dowel pins or additional dowel pins to align the light-emitting module relative to a module holder and/or a secondary optic. All in all, a very precisely aligned optical arrangement in which a light source is followed by a first optical element and, optionally, a further optical element can thus be manufactured in a particularly simple manner.

According to at least one embodiment of the light-emitting module, the dowel pins of the optical element are configured as star-shaped in cross section. That is, at least that end of a dowel pin that engages in a corresponding recess in the carrier has a star-shaped cross-sectional area. Variations in dimensional accuracy, i.e., for example variations in the lateral extent of the carrier or the lateral extent of the dowel pins, can be compensated for particularly well in this way. This choice is based on the realization, inter alia, that a dowel pin that is configured as star-shaped is better able to adapt to a recess into which it is pressed than if the dowel pin is configured, for example, as a solid cylinder with smooth lateral surfaces.

According to at least one embodiment of the light-emitting module, at least one dowel pin of the optical element has a diameter that varies along the dowel pin. The diameter can be, for example, varied longitudinally to the dowel pin such that it is adapted to different diameters of the recesses in the carrier, in the module holder and/or in the secondary optic. It is further possible for the dowel pins to be configured such that the optical element stands on legs, as it were, that extend along the optical element. The end of such a dowel pin, which for example engages in the recess of a carrier, can have a smaller diameter than the rest of the dowel pin. It is further possible for the cross section of the dowel pins to vary continuously in the axial direction. The dowel pin is then fashioned as a truncated pyramid or a truncated cone.

According to at least one embodiment of the light-emitting module, a reservoir, for example for an adhesive, is disposed around at least one of the dowel pins. The reservoir can be configured for example in the form of a circumferential channel around the dowel pin. If the optical element is attached to the carrier by means of an adhesive, such as a glue, for example, the channel is suitable for receiving excess adhesive.

According to at least one embodiment of the light-emitting module, the optical element includes a holder and an optic body. Such a holder is suitable for mechanically holding the optic body. The dowel pins of the optical element are preferably mounted on the holder or integrally configured with the holder. The optic body represents the optical component proper of the optical element. The optic body is, for example, suitable for beam-shaping the radiation that passes through it. The holder is preferably mounted on or connected to the optic body in such a way that it has little or, insofar as possible, no influence on the optical properties of the optic body.

According to at least one embodiment of the light-emitting module, the optic body is configured as an optical concentrator that tapers toward the light source. According to at least one embodiment of the module, the optic body can be formed at least locally in the manner of at least one of the following basic optical elements: a compound parabolic concentrator (CPC), a compound elliptic concentrator (CEC), a compound hyperbolic concentrator (CHC). That is, the lateral faces of the optical element are formed at least locally in the manner of one of these basic optical elements. It is further possible for the optical concentrator to be formed at least locally in the manner of a truncated cone or truncated pyramid that tapers toward the light source. The optic body can be configured as a solid body. It is also possible, however, for the optic body to be a hollow body whose inner surfaces are implemented as reflective, for example are reflectively coated.

According to at least one embodiment of the light-emitting module, the optic body of the optical element includes a radiation exit face that can be curved in one of the following ways: spherically, aspherically, elliptically.

According to at least one embodiment of the light-emitting module, the optic body of the optical element is configured as a solid body. The optic body then preferably contains a transparent material. Reflections at the lateral faces of the optic body then preferably occur by total reflection. The optic body preferably contains or is made of a transparent synthetic material. Particularly preferably, the optic body contains or is made of one of the following materials: PMMA, PMMI, PC, Makrolon, APEC, glass.

According to at least one embodiment of the light-emitting module, the holder of the optical element laterally embraces the optic body. In this case, the holder is, for example, fashioned in a frame shape around the light source. The optic body then sits on the holder, is formed onto the holder, or is otherwise attached to the holder. The holder can be configured with dowel pins that engage in the corresponding recesses in the carrier. The holder and the optic body can be configured in one piece. That is, they are integrally connected to each other. It is also possible, however, for the optical element to be configured in more than one piece. The holder is then a separate element into which the optic body can be plugged, placed, snapped or glued.

According to at least one embodiment of the module, the holder of the optical element has locally curved lateral faces. For this purpose, the holder can for example be configured at least locally in the manner of a hollow cylinder. "In the manner of a hollow cylinder" means here that the side walls of the holder are curved at least locally in the manner of a cylinder having a circular, elliptical or oval base. The side walls of the holder can then also, however, be configured locally as planar, i.e. without curvature. Such planar areas of the side walls of the holder can, for example, simplify the mounting and production of the optical element.

The frame-shaped holder makes use of the realization, inter alia, that thermal tensions in the optical element can be compensated for particularly well by such a holder. Should the optical element become heated during the operation of the light source, then the holder attached to the carrier expands in a direction away from the carrier. The optic body is preferably attached to the holder in at least two locations at the upper side of the holder, i.e., the side facing away from the carrier. It therefore expands away from the upper side of the holder, in the direction of the carrier. The holder and the optic body preferably have matched temperature expansion coefficients. To this end, the holder and the optic body can, for example, be made of the same material.

In this way, the thermal expansion of the holder away from the carrier and the thermal expansion of the optic body toward the carrier balance each other out. The distance of a light entrance face of the optic body from the light source thereby remains at least roughly constant.

If the holder of the optical element additionally has lateral faces that are at least locally curved, then thermal tensions in the optical element are compensated particularly efficiently in a plane parallel to the carrier. This construction for the optical element then makes it possible to position the optical element especially precisely relative to a light source in a plane parallel to the carrier, even in the event of heating of the module.

According to at least one embodiment of the light-emitting module, the optical element is configured as box-like. That is, for example the holder of the optical element is shaped in the manner of a box, which can also have curved lateral faces. The holder surrounds the light source disposed on the carrier, preferably on at least four sides. That is, the optical element, in addition to its optical properties, constitutes a protection for the light source against mechanical stress and dirt.

According to at least one embodiment of the light-emitting module, the optical element is configured in one piece. That is, all components of the optical element, such as the dowel pins, the holder and the optic body, are integrally connected to one another. All parts of the optical element are then preferably made of the same material. The optical element can in this case preferably be produced via an injection molding process.

According to at least one embodiment of the light-emitting module, the optical element is configured in more than one piece. That is, at least one part of the optical element, such as a dowel pin, the optic body or the holder, is produced separately from other components of the optical element. In this case as well, the individual components can be made via an injection molding process. However, it is also possible in this case to make different components out of different materials. It is further possible, for example, for the holder not to be implemented as transparent, but to be colored or blackened.

According to at least one embodiment of the light-emitting module, the light source includes at least one LED chip. Particularly preferably, the light source includes a plurality of LED chips of thin-film construction.

A thin-film LED chip can be distinguished particularly by the following features:

Applied to or configured on a first main surface, facing a carrier element, of a radiation-generating epitaxial layer sequence is a reflective layer that reflects at least a portion of the electromagnetic radiation generated in the epitaxial layer sequence back thereinto. The reflective layer is, for example, a Bragg mirror. Particularly preferably, it is a metal mirror that is formed for example by a thin layer containing at least one material of the group including silver, gold, gold-germanium, aluminum and platinum.

The epitaxial layer sequence has a thickness in the range of 20 µm or less, particularly in the range of 10 µm. To generate electromagnetic radiation, the epitaxial layer thickness contains for example a pn junction, a single quantum well or a multiple quantum well structure. In the context of the application, the term "quantum well structure" encompasses any structure in which charge carriers undergo quantization of their energy states by confinement. In particular, the term "quantum well structure" carries no implication as to the dimensionality of the quantization. It therefore includes, among other things, quantum troughs, quantum wires and quantum dots and any combination of these structures.

The epitaxial layer sequence contains at least one semiconductor layer with at least one area having an intermixing structure that leads in the ideal case to a nearly ergodic distribution of the radiation in the epitaxial layer sequence, i.e., it has a scattering behavior that is as ergodic-stochastic as possible.

Particular advantageously, as a result, the carrier element can be relatively freely selected compared to a growth substrate. For instance, the carrier can be better suited to the component with respect to many properties, such for example electrical and/or thermal conductivity or stability, than growth substrates, which are subject to tight constraints in the production of high-quality epitaxially grown layer sequences. For instance, in order to obtain high-quality epitaxial layers, the epitaxially deposited material must, for example, be lattice-matched to the growth substrate.

A basic principle of a thin-film LED chip is described, for example, in I. Schnitzer et al., "30% external quantum efficiency from surface textured LEDs," Appl. Phys. Lett., October 1993, Vol. 63, pp. 2174-2176, whose disclosure content is hereby incorporated by reference.

According to at least one embodiment of the light-emitting module, the LED chips are free of potting compound. This is possible in particular when the optical element is configured as box-like and surrounds the LED chips on at least four sides. The LED chips are thereby protected against mechanical stress and dirt even when no potting compound is used.

According to at least one embodiment, a gap is disposed between an LED chip of the light source and a light entrance face of the optical element. The gap is for example filled with a gas, preferably with air.

According to at least one embodiment of the light-emitting module, the optical element of the light-emitting module has an area of contact with an encapsulant of an LED chip of the light source. To bring this about, a light entrance face of the optical element can be pressed into an encapsulant of the LED chip. Said encapsulant of the LED chip either can be hardened after the optical element is put in place, or it can be a soft, gel-like encapsulant that does not have to be hardened.

It is also possible, however, for the LED chip initially to be potted with a potting compound that hardens. The potted LED chip can then be encased in another potting compound that is gel-like. This potting compound preferably does not harden completely. The light entrance face of the optical element is then pressed into this gel-like potting compound during the mounting of the optical element on the carrier. The gel-like encapsulant can be, for example, a coupling gel or an index matching gel. Such a potting compound is particularly well suited to create optical coupling between the LED chip and the optical element, so that only a small refractive index step or none at all occurs as electromagnetic radiation from the light source enters the optical element.

According to at least one embodiment, the distance between the light entrance face of the optical element and the light exit face of the LED chip is no more than 250 µm, preferably no more than 200 µm. Such a small distance between the optical element and the LED chip makes it possible to couple the largest possible portion of the electromagnetic radiation emitted by the LED chip into the optical element.

According to at least one embodiment, the light-emitting module is provided as a light source in an optical projection apparatus or in a motor vehicle projection lamp, for example a headlight.

According to at least one embodiment, the optical element comprises at least two dowel pins that engage in corresponding recesses in the carrier. This is a particularly efficient means of preventing the optic from twisting relative to the light source during the mounting of the optical element. The optical element preferably has three or four dowel pins that engage in corresponding recesses in the carrier.

According to at least one embodiment, the optical element is glued onto the carrier in order to attach the optical element. It is further possible for the dowel pins to be hot-stamped and for the optical element to be mechanically attached to the carrier in this fashion.

DESCRIPTION OF THE DRAWINGS

Further advantages, preferred embodiments and improvements of the light-emitting module and its constituent parts will emerge from the exemplary embodiment described below in conjunction with the figures. Therein:

FIGS. 9a and 9b are schematic perspective representations of an exemplary embodiment of a preferably one-piece optical element in the nature of an optical concentrator, comprising dowel pins configured as "legs" for mounting on the carrier, said dowel pins being disposed laterally on the light exit face of the optical element, FIGS. 10a and 10b are schematic perspective representations of an exemplary embodiment of a preferably multi-piece optical element in the nature of an optical concentrator, comprising an optic body and a holder, FIGS. 16a, 16b, 16c, 16d and 16e are schematic perspective representations of an exemplary embodiment of a light-emitting module with a multi-piece optical element comprising an optic body and a holder.

DETAILED DESCRIPTION OF THE PREFERRED EMBODIMENTS

Figure 1:
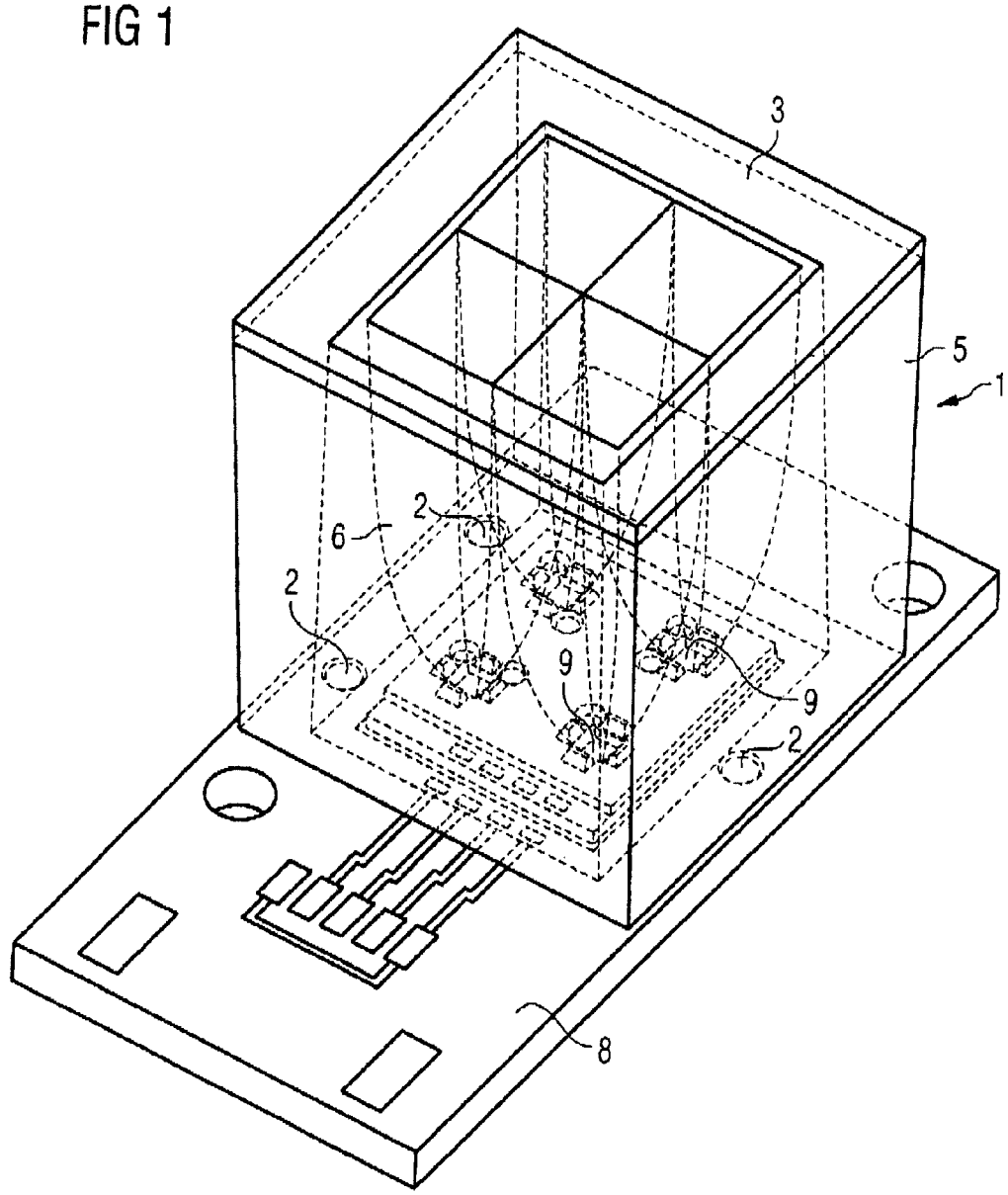
FIG. 1 is a schematic perspective representation of an exemplary embodiment of a light-emitting module comprising a light source, a carrier for the light source, and an optical element, wherein the optical element comprises dowel pins that engage in corresponding recesses in the carrier.

In the exemplary embodiments and figures, like or like-acting elements are provided with the same respective reference numerals. The illustrated elements in the figures are not necessarily to be considered true to scale, but rather, individual elements may be depicted in part as exaggeratedly large for the sake of better understanding.

FIG. 1 shows a schematic perspective representation of a first exemplary embodiment of the light-emitting module described here. FIG. 1 shows an optical element 1, which is attached to a carrier 8. Said carrier 8 is, for example, a circuit board with conductive traces by means of which the light sources are electrically contacted. The circuit board is, for example, a metal-core board that may contain a material that is a good thermal conductor, such as copper or aluminum.

The light sources are, for example, LED chips 9. Said LED chips 9 can be placed on a ceramic substrate. The ceramic substrate preferably comprises through-contacts, e.g. vias, by means of which the LED chips 9 are connected electrically conductively to the conductive traces of the carrier. The ceramic substrate then preferably contains at least one of the following materials: aluminum nitride, aluminum oxide, glass-ceramic, glass, metal.

The optical element comprises a holder 5 and an optic body 6. In the exemplary embodiment of FIG. 1, holder 5 and optic body 6 are configured in one piece. To bring this about, for example the optical element 1 is produced via an injection molding or transfer molding process. The optic bodies 6 of the optical element 1 are, for example, optical concentrators, each of which tapers toward the respective LED chip 9. That is, the cross-sectional area of each concentrator decreases in the direction of the respective LED chip 9.

As described earlier hereinabove, the lateral faces of the optic bodies 6 can be configured at least locally in the manner of at least one of the following optical elements: CPC, CHC, CEC, truncated pyramidal optic, truncated conical optic. The optic body 6 can be configured as a hollow body whose inner surfaces are coated with a reflective material suitable for reflecting at least a large proportion of the electromagnetic radiation generated by the LED chip 9 during operation. The inner surfaces of the optic body 6 are preferably coated with a metal in that case.

The optic bodies 6 can serve to reduce the divergence of, to beam-shape, and/or to intermix the radiation passing through it.

The optic bodies 6 are followed in the beam direction by a light exit face 3 of the optical element 1. The light exit face is constituted for example by a transparent plate, which is preferably made from a material having the same thermal expansion coefficient as the holder 5 and the optic bodies 6. The plate is preferably made from the same material as the other components of the optical element. For this purpose, the light exit face 3 can, for example, be configured in one piece with the other elements of optical element 1.

Optical element 1 comprises dowel pins 2. The dowel pins 2 are preferably configured integrally with holder 5. They are preferably produced in an injection molding process together with the holder 5 and the optic bodies 6.

In the exemplary embodiment of FIG. 1, optical element 1 comprises three dowel pins. These dowel pins are alignment pins that engage in corresponding recesses in the carrier 8. For mechanical attachment to the carrier 8, the optical element 1 can be glued to the carrier 8 with an adhesive at the contact surface between the holder 5 and the carrier 8. Alternatively or additionally, it is possible for the optical element 1 to be mechanically connected to the carrier 8 by means of the dowel pins 2 by press-fitting. That is, the recesses in the carrier 8 have a slightly smaller diameter than the dowel pins 2. When the dowel pins 2 are pressed mechanically into the recesses in the carrier, mechanical attachment of the optical element to the carrier then occurs at the same time as the alignment.

In the exemplary embodiment of FIG. 1, optical element 1 is configured as box-like. That is, the lateral faces of the holder 5 completely surround the LED chip 9 in the manner of a box. There is no need for the LED chips 9 to be potted in this case. The box-like embodiment of the optical element 1 constitutes protection for the LED chips 9 against mechanical stress and dirt.

Advantageously, the optic body 6 can be adapted particularly well to the LED chips in this case. The optic body 6 can for example be brought especially close to the LED chips 9, thus making it possible to choose a smaller height for the optic. The distance between a light entrance face 4 of the optic body 6 and the radiation exit face of an LED chip 9 is preferably between 100 and 300 µm, particularly preferably between 150 and 250 µm. In this exemplary embodiment, the distance between the entrance face 4 of the optical element and the respective radiation exit faces of the LED chips 9 is limited only by any bonding wires used to contact the LED chips 9, for example on the n side. In this exemplary embodiment, a gap, which is filled with a gas, for example air, is preferably present between the respective radiation exit faces of the LED chips 9 and the light entrance face 4 of the optical element 1.

Figure 2:
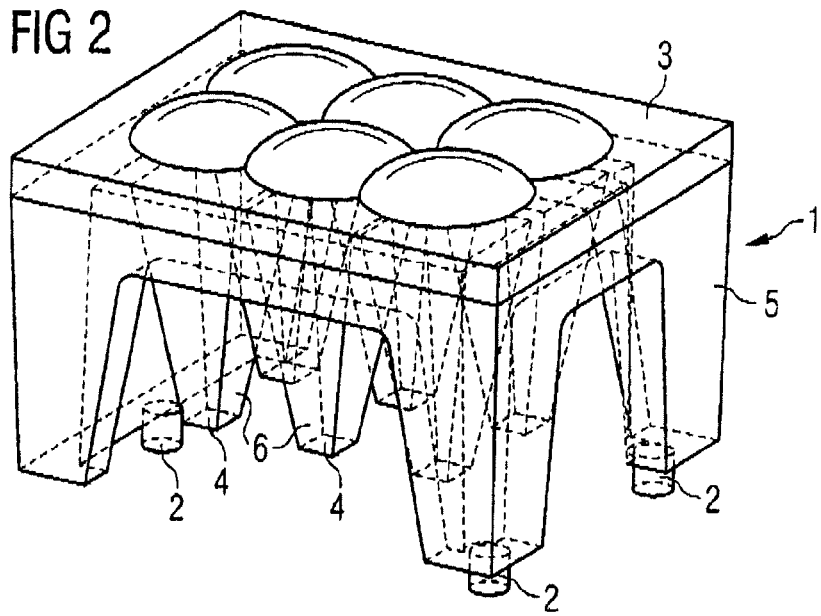
FIG. 2 is a schematic perspective representation of an exemplary embodiment of a preferably one-piece optical element for the light-emitting module.

FIG. 2 shows a schematic perspective representation of a second exemplary embodiment of an optical element 1 preferably configured in one piece. As in the exemplary embodiment of FIG. 1, the optical element comprises a holder 5 and an optic body 6. In contrast to the exemplary embodiment of FIG. 1, the optical element 1 in the exemplary embodiment of FIG. 2 is not implemented as box-like. The optic bodies 6 are preferably configured as solid bodies. For example, the optical element 1 is formed from a transparent material, such as, for example, a transparent synthetic material. The optical element 1 preferably contains or is composed of at least one of the following materials: COC, PMMA, PMMI, PC, Makrolon, APEC.

In the exemplary embodiment of FIG. 2, the optic bodies 6 are each configured in the manner of a truncated pyramid that tapers toward the light entrance opening 4 of each optic body 6. The light exit opening 3 of the optical element 1 is bowed in a lens-like manner over each optic body 6. For one thing, this can serve to effect beam shaping, and for another, this conformation of the light exit face 3 increases the outcoupling probability of the electromagnetic radiation passing through the optic bodies 6.

Such a lensoidally shaped light exit face 3 is preferably configured in one piece with holder 5 and optic bodies 6. The entire optical element 1 is preferably fabricated in one piece in an injection molding or transfer molding process.

The optical element 1 further comprises dowel pins 2 that serve to align the optical element 1 on and/or attach it to a carrier 8 and are also formed as a single piece with the optical element 1.

Holder 5 surrounds the optic bodies 6 at their respective upper sides, i.e., in the vicinity of the light exit opening 3 of optical element 1. This ensures that the optical properties of the optic bodies 6 will be influenced as little as possible by holder 5. For example, radiation can be coupled into optic bodies 6 at the respective light entrance openings 4 of optic bodies 6 without any interfering reflections from a holder of the optic bodies 6.

Optical element 1 is, for example, attached to a carrier 8, as shown in the exemplary embodiment of FIG. 1. Each optic body 6 is preferably disposed after exactly one LED chip 9. Preferably disposed between the optic body 6 and the LED chip 9 is an encapsulant of the LED chip or an index matching gel. This yields enhanced optical coupling of the LED chip to the associated optic body 6. That is, the probability of reflections from the light entrance opening 4 is reduced. The distance between the radiation exit face of each LED chip 9 and the light entrance opening 4 of the associated optic body 6 is preferably about 200 µm. The encapsulant of each LED chip 9 and the light entrance opening 4 of the associated optic body 6 preferably have an area of contact.

To bring this about, a light entrance face 4 of the optical element 1 can be pressed into the encapsulant of the LED chip 9. The encapsulant of the LED chip 9 can in this case either be hardened after the optical element 1 is put in place, or it can be a soft, gel-like encapsulant that does not have to be hardened.

It is also possible, however, for the LED chip 9 first to be potted with a potting compound that hardens. The potted LED chip 9 can then be encased in another potting compound that is gel-like. This potting compound preferably does not harden completely. The light entrance face 4 of the optical element 1 is then pressed into this gel-like potting compound during the mounting of the optical element 1 on the carrier 8. The gel-like encapsulant is for example a coupling gel or an index matching gel. Such a potting compound is particularly well suited to create optical coupling between the LED chip 9 and the optical element 1, so that only a small refractive index step or none at all occurs as electromagnetic radiation from the light source 9 passes into the optical element 1.

Figure 3:
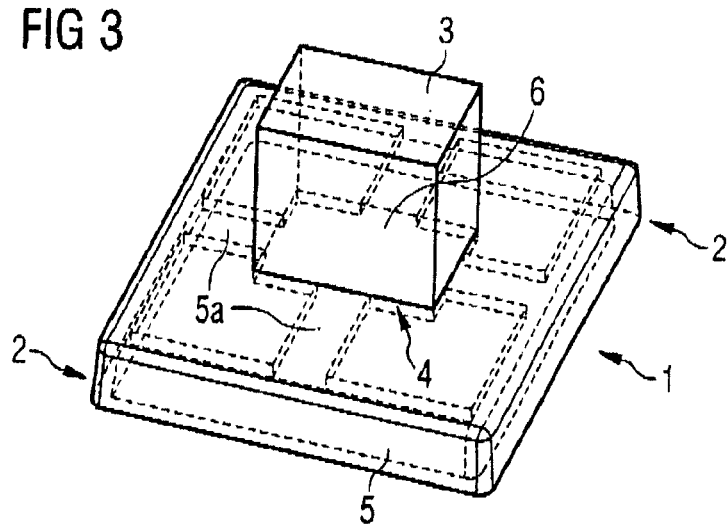
FIG. 3 is a schematic perspective representation of an exemplary embodiment of a preferably one-piece frame-like optical element for the light-emitting module.

FIG. 3 shows a further exemplary embodiment of an optical element 1. In this exemplary embodiment, the optic body 6 is in the form of a cuboid, which can, for example, be disposed after a multiplicity of LED chips 9. The cuboid can be configured as a reflective hollow body or, preferably, as a solid body. In that case, the optic body 6 is formed for example from one of the above-cited transparent synthetic materials. The optic body 6 serves as a light mixer. It can, for example, be disposed after LED chips 9 that are suitable for emitting light of different colors. The optic body 6 then mixes these colors to produce light of a uniform color, for example white light. The optic body 6 is preferably configured in one piece with a holder 5. The holder 5 comprises, on at least two diagonally opposite sides, dowel pins 2 for aligning and/or mounting the optical element 1 on a carrier 8. The optical element 1 is preferably fabricated in an injection molding or transfer molding process. In the exemplary embodiment of FIG. 3, the optic body 6 is attached to webs 5a of the holder 5 at light entrance opening 4.

Figure 4:
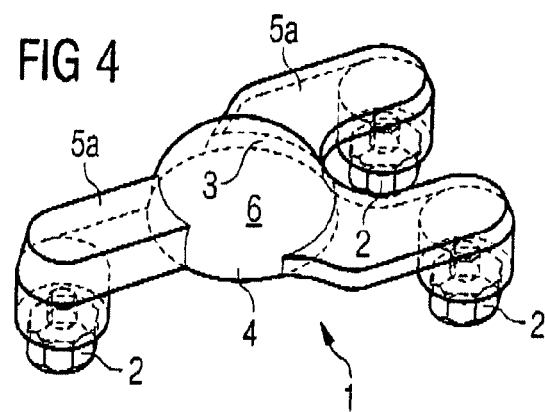
FIG. 4 is a schematic perspective representation of an exemplary embodiment of a preferably one-piece optical element for the light-emitting module comprising star-shaped dowel pins.

FIG. 4 shows a schematic perspective representation of a further optical element 1. The optic body 6 is configured as lens-like in this exemplary embodiment. In particular, the light exit opening 3 of the optic body 6 can be convexly outwardly curved in the manner of a convergent lens. The light exit opening 3 in this case exhibits at least one of the following curvatures: spherical, aspherical, elliptical. The curvature of the light exit opening advantageously reduces the probability of total reflection as light exits the optic body 6. The optic body 6 is preferably followed by a plurality of LED chips 9. It is also possible, however, as in the exemplary embodiment of FIG. 4, for the optical element 1 to be disposed after exactly one LED chip 9. The optic body 6 is held by three webs 5a, at the ends of which are preferably disposed dowel pins 2 for aligning the optical element 1 on and/or attaching it to a carrier 8. In the illustrated exemplary embodiment, the dowel pins are configured as star-shaped. Variations in dimensional accuracy can be compensated for particularly well in this way. The optical element of FIG. 4 is preferably configured in one piece and is produced via an injection molding or a transfer molding process.

Figure 5:
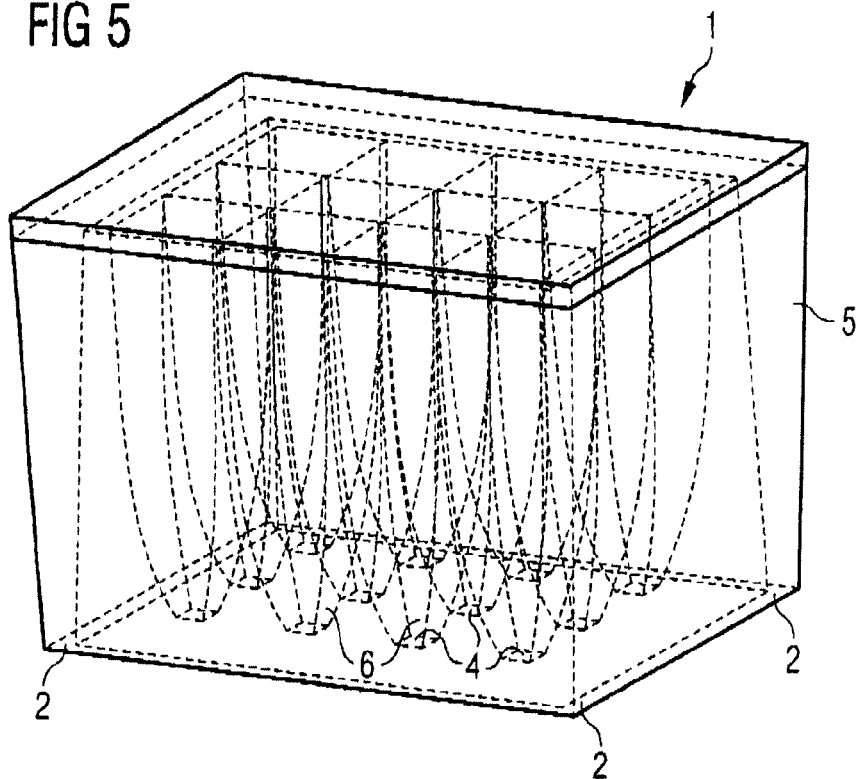
FIGS. 5, 6, 7 and 8 are schematic perspective representations of four variants of an exemplary embodiment of a preferably one-piece optical element in the nature of an optical concentrator, partially in a box-like embodiment.

FIG. 5 shows a schematic perspective representation of an exemplary embodiment of an optical element 1 similar to that described in FIG. 1. This optical element comprises nine optic bodies 6, each preferably disposed after a single LED chip 9. The optical element 1 of FIG. 5 is fashioned as box-like, so the LED chip 9 need not be potted if circumstances so require.

Figure 6:
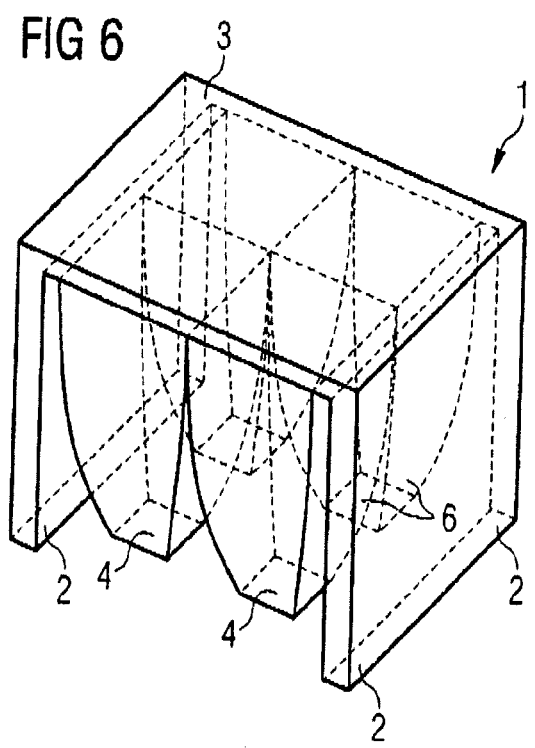

FIG. 6 shows a schematic perspective representation of a further exemplary embodiment of an optical element 1. In contrast to the exemplary embodiment of FIGS. 1 and 5, this optical element 1 is not configured as box-like.

Figure 7:
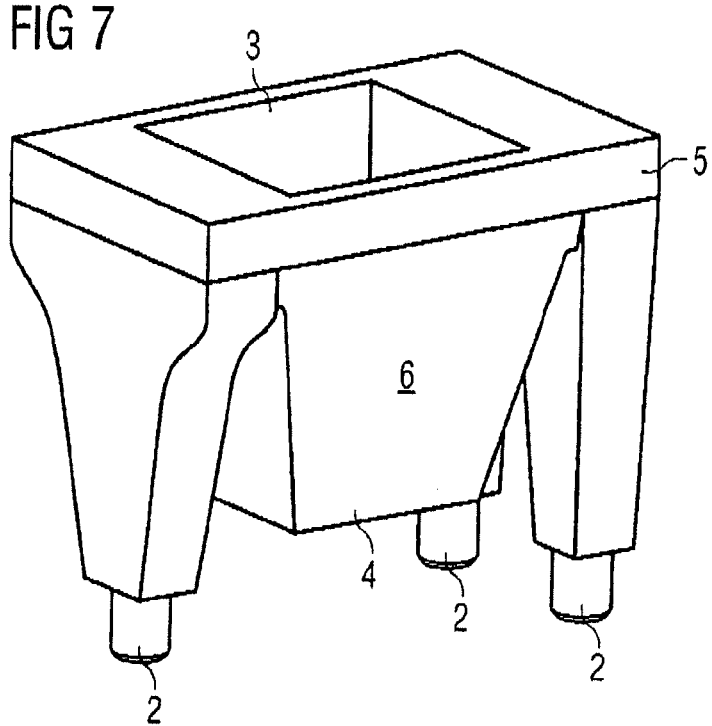

FIG. 7 shows a schematic perspective representation of another exemplary embodiment of the optical element 1. In contrast to the exemplary embodiments of FIGS. 1, 2, 5 and 6, this optical element 1 has as its optic body 6 a single optical concentrator. Optic body 6 is configured, for example, as a hollow body whose inner walls are reflectively coated. The optical element 1 is preferably disposed after a plurality of LED chips 9, as illustrated in FIG. 7.

Figure 8:
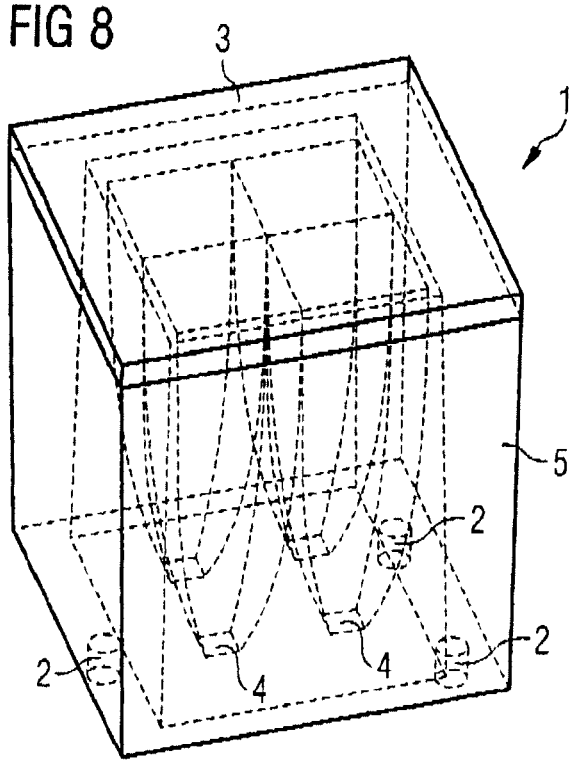

FIG. 8 shows a schematic perspective representation of a further exemplary embodiment of optical element 1 similar to the exemplary embodiment of optical element 1 described in connection with FIG. 1.

FIGS. 9a and 9b show schematic perspective representations of an exemplary embodiment of a further optical element. In the exemplary embodiments of FIGS. 9a and 9b, the optic body 6 is configured in one piece with a holder 5. Said holder 5 is formed in part by the light exit face 3 of optical element 1. Legs are mounted laterally on the light exit face 3 and extend longitudinally of optic body 6. In the exemplary embodiment of FIG. 9a, dowel pins 2 for aligning the optical element 1 on and/or attaching it to a carrier 8 are mounted on the opposite end faces of the respective legs from light exit face 3. In the exemplary embodiment of FIG. 9b, the legs themselves form dowel pins 2. The optical elements 1 shown in FIGS. 9a and 9b preferably are each configured in one piece.

FIGS. 10a and 10b show schematic perspective representations of two exemplary embodiments of an optical element configured in more than one piece. In the exemplary embodiment of FIG. 10a, holder 5 grips optic body 6, which is preferably configured as a solid body, at only two positions. The optical properties of the optic body 6 thus are influenced only slightly by the holder 5.

FIG. 10b shows an optical element 1 that is preferably disposed after a multiplicity of LED chips 9. As the optic body 6, an optical concentrator is snapped into side walls of the holder 5. The side walls of the holder 5 are held together by a sleeve 5b, which, for example, is slipped over the side walls and locally embraces them. The snapped-in optic body 6 can be either a hollow body whose inner surfaces are reflectively coated or a solid body.

Figure 11:
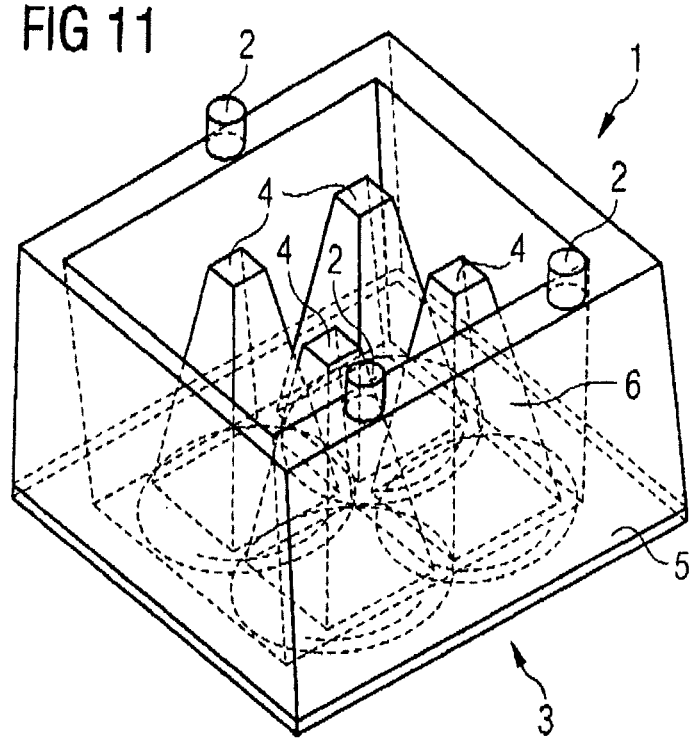
FIGS. 11 and 12 are schematic perspective representations of two variants of an exemplary embodiment of a preferably one-piece optical element in the nature of an optical concentrator, partially in a box-like embodiment.

FIG. 11 shows a schematic perspective representation of a further exemplary embodiment of an optical element 1. The optical element 1 depicted in FIG. 11 is similar to the exemplary embodiment of FIG. 2. The optical element is fashioned as box-like. The optic bodies 6 of the optical element 1 are preferably solid bodies having the shape of truncated pyramids. However, other optical concentrators, for example such as those described in the general part of the description, can also be employed as optic bodies 6.

Figure 12:
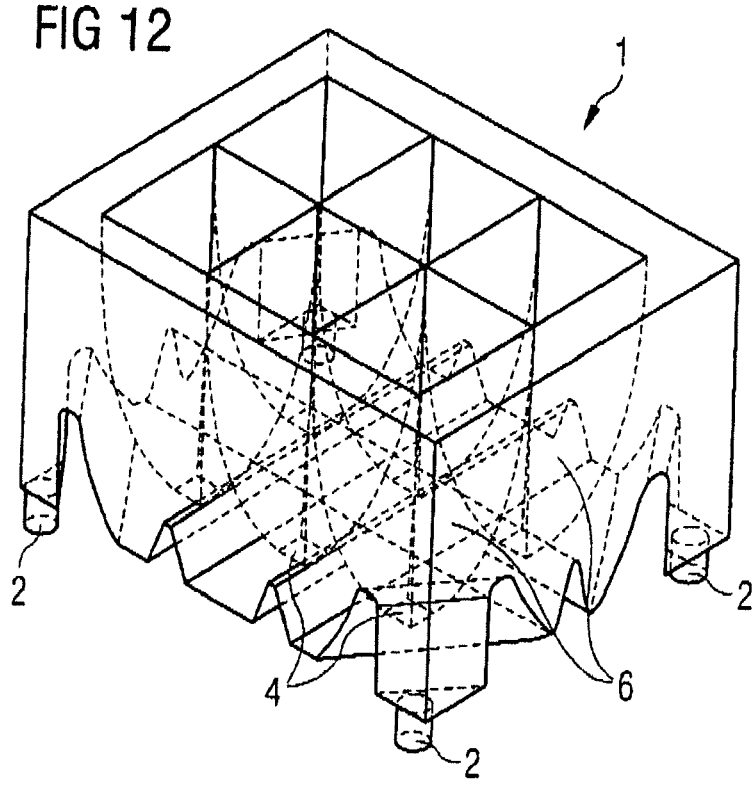

FIG. 12 shows a schematic perspective representation of a further exemplary embodiment of an optical element 1 similar to the exemplary embodiment of FIG. 1. Here, however, the optical element is not configured as box-like, but the holder 5 is instead at least partially open on four sides. Disposed at four corners of the rectangularly shaped optical element 1 are dowel pins 2 for aligning and/or mounting the optical element 1.

FIGS. 13a to 13f show schematic perspective representations of a further exemplary embodiment of optical element 1. In this exemplary embodiment, optical element 1 is configured in more than one piece. Optical element 1 comprises an optic body 6 depicted in FIGS. 13a and 13b. Said optic body 6 is comprised of an optical concentrator and a light exit face 3. The optical concentrator is preferably configured as a solid body, which can, for example, be made from one of the above-cited transparent synthetic materials. In the exemplary embodiment of FIGS. 13a to 13f, the optic body 6 is configured in one piece with the light exit face 3. Light exit face 3 juts past the optical concentrator at the side edges, so that dowel pins 2 for aligning and/or mechanically attaching the optic body 6 in a holder 5 are freely accessible.

Exemplarily, a plurality of LED chips 9 can be arranged at the light entrance face 4 of the optic body 6. For example, five LED chips 9 are arranged in a straight line at light entrance face 4. Optic body 6 preferably has on its light entrance face 4 an area of contact with an encapsulant of the LED chips 9. That is, the optical element 1 is pressed by its light entrance face 4 for example into the encapsulant of the LED chips 9.

Figure 13A:
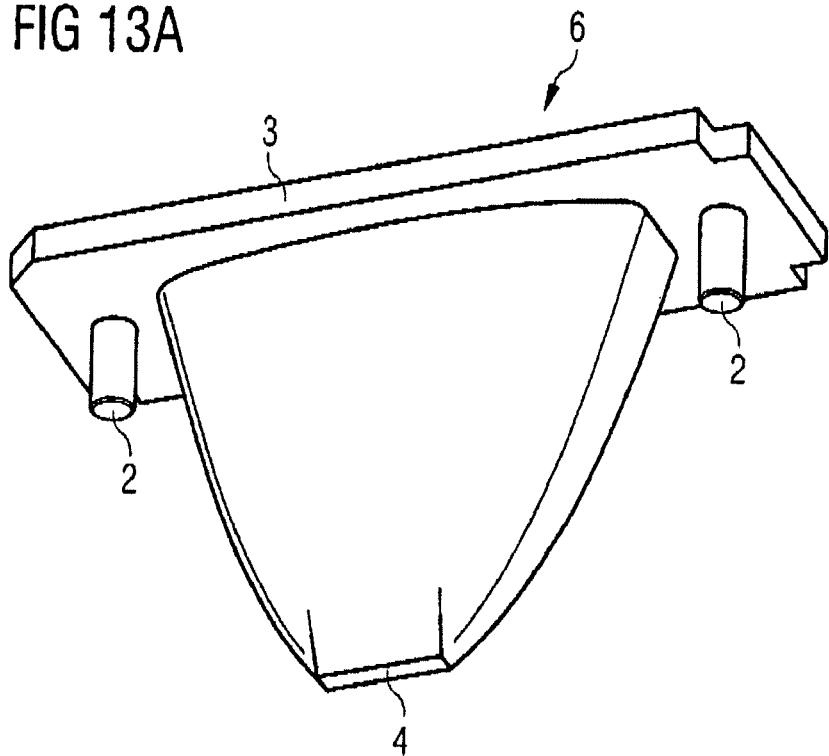
FIGS. 13a, 13b, 13c, 13d, 13e and 13f are schematic perspective representations of an exemplary embodiment of a preferably multi-piece optical element in the nature of an optical concentrator comprising an optic body and a holder or in the nature of a corresponding light-emitting module.
Figure 13B:
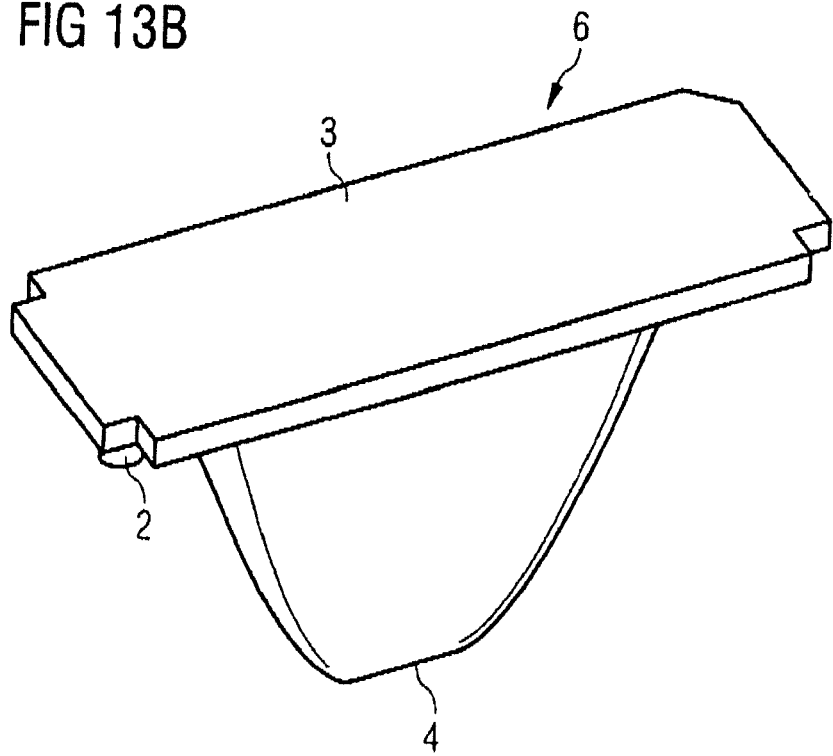

The optic body 6 illustrated in FIGS. 13a and 13b is preferably fabricated in an injection molding process or in a transfer molding process. It is particularly suitable for projection lamp applications in a motor vehicle. For example, an optic body 6 of the kind described in conjunction with FIGS.

13a and 13b serves to form a relatively wide light distribution that is suitable for illuminating the space in front of a motor vehicle with utmost uniformity.

Figure 13C:
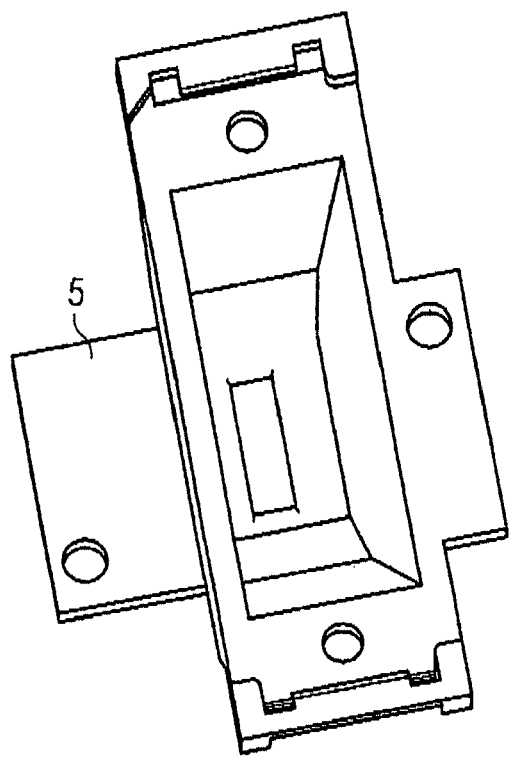
Figure 13D:
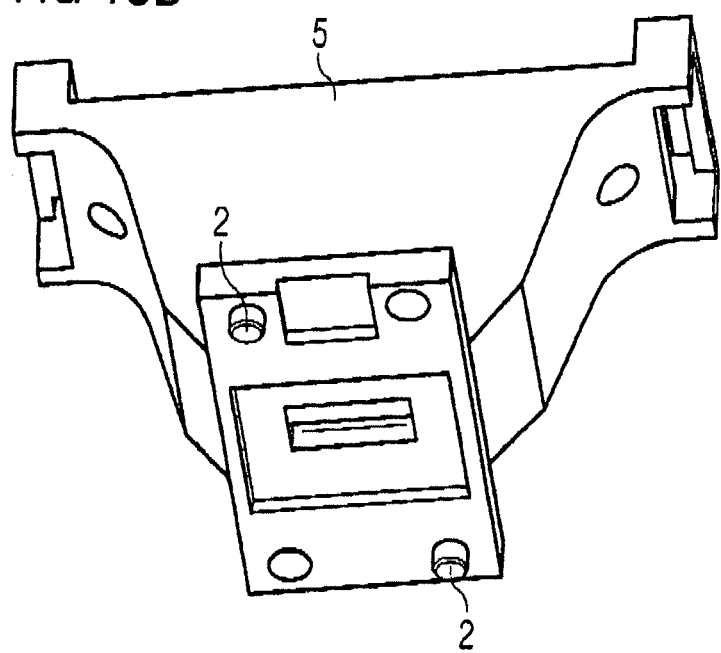
Figure 13E:
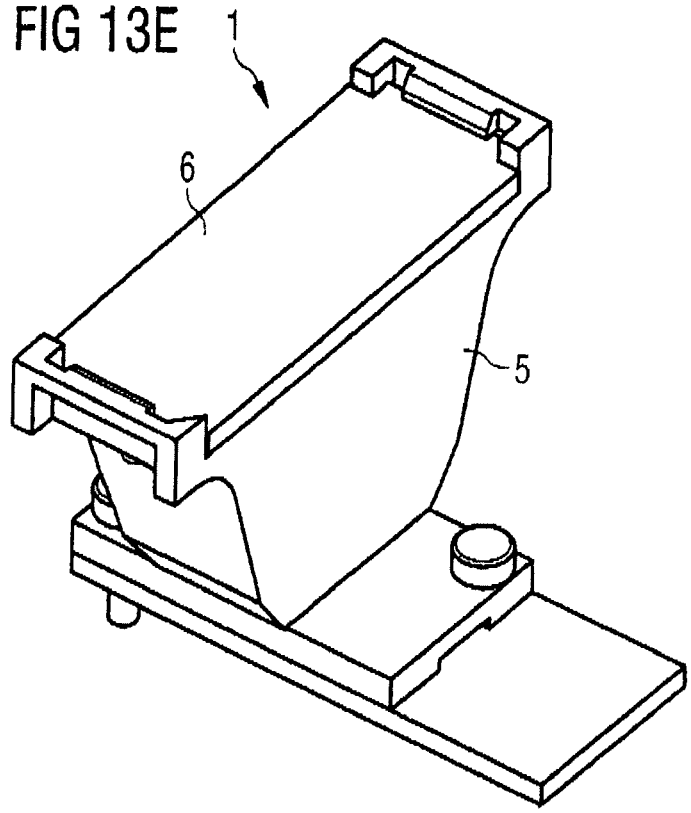

FIGS. 13c and 13d show a holder 5 for the optic body 6 of FIGS. 13a and 13b. Said holder 5 is adapted to the optic body 6 such that the optic body 6 can be snapped into the holder 5 and/or pressed or glued together with the holder 5 at the edge of light exit face 3. The dowel pins 2 at light exit face 3 preferably serve in this case to align and mechanically attach the optic body 6 in the holder 5. The holder 5 comprises a base body with an opening to receive the optic body 6, and a baseplate. The baseplate comprises dowel pins 2 for aligning the holder 5 on a carrier 8. The holder 5 is preferably fashioned in a single piece. The thermal expansion coefficient of the holder 5 is matched to that of the optic body 6. The holder 5 can, for example, be made of the same material as the optic body 6. It is further possible for the holder 5 to be colored or blackened.

Figure 13F:
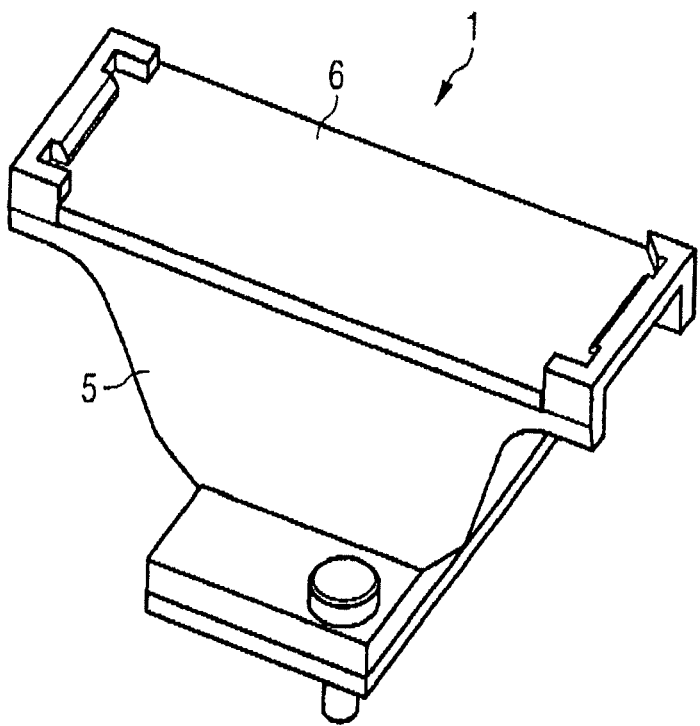

FIGS. 13f and 13g show the optical element 1, comprised of an optic body 6 and a holder 5, disposed on a carrier 8 constituted for example by a carrier 8 of the kind described in connection with FIG. 1. The optic body 6 here is snapped into the holder 5.

Figure 14A:
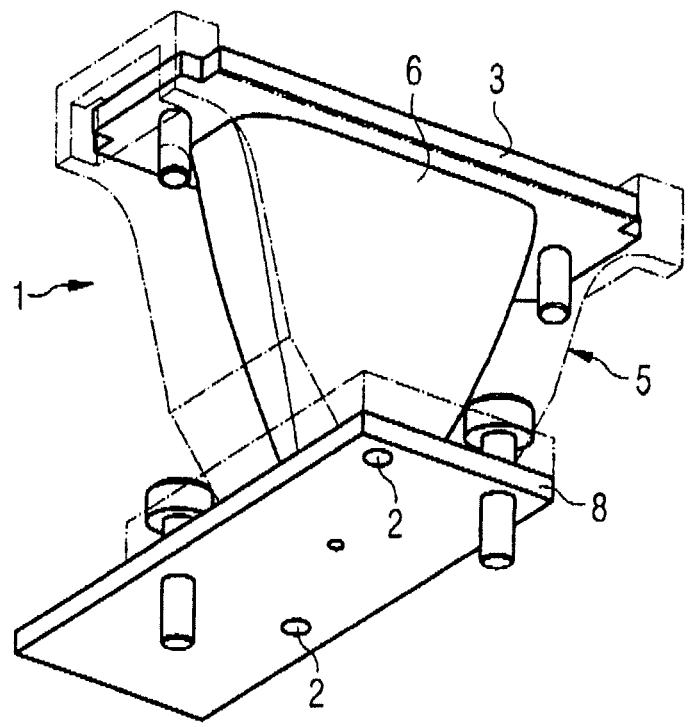
FIGS. 14a, 14b and 14c are schematic perspective representations of an exemplary embodiment of a light-emitting module with a multi-piece optical element comprising an optic body and a holder.
Figure 14B:
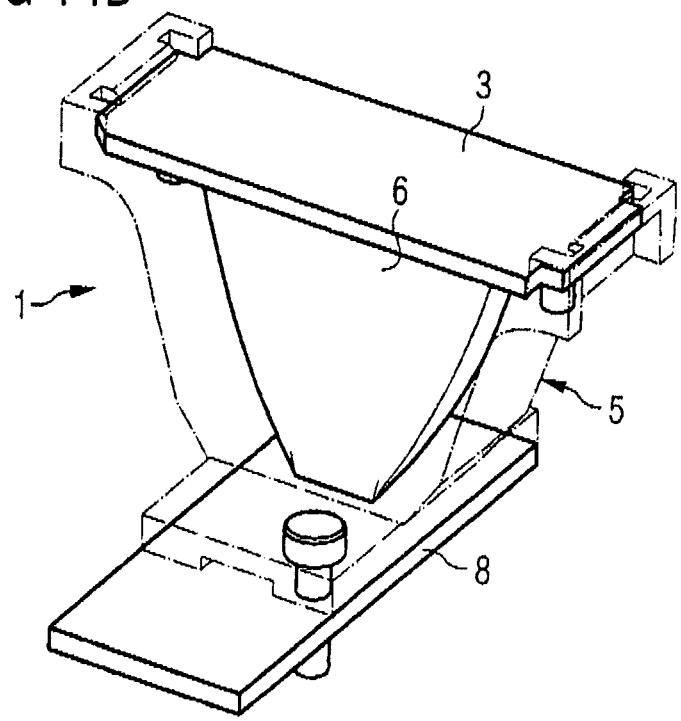
Figure 14C:
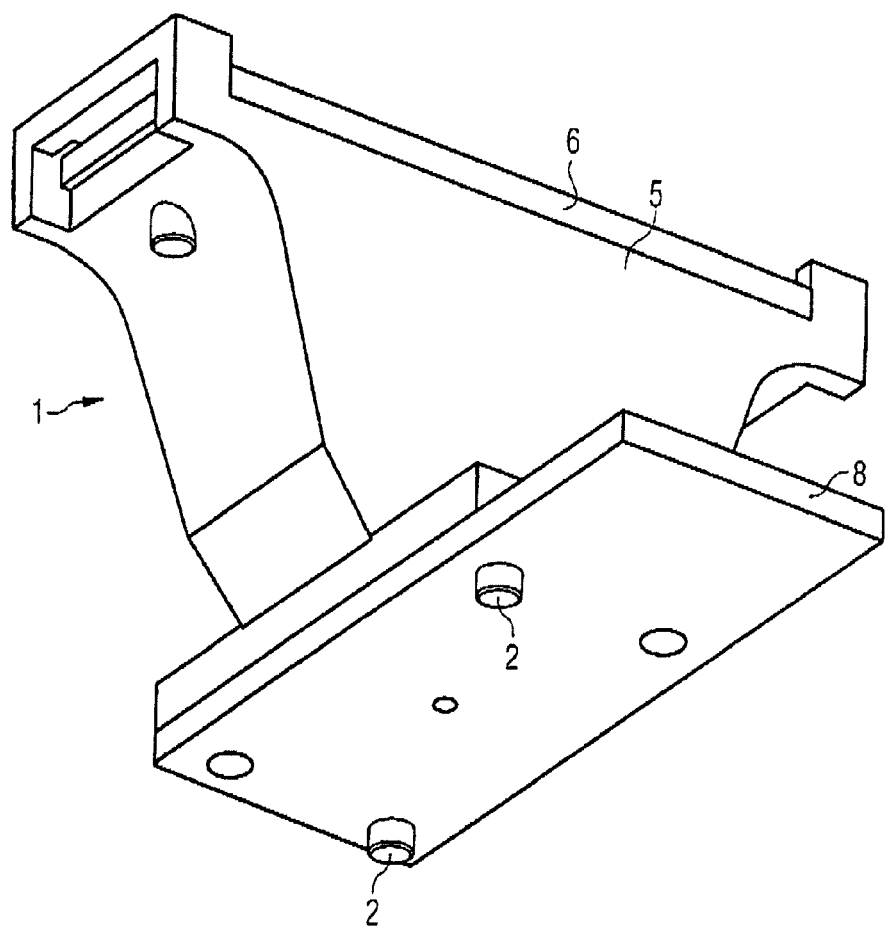
Figure 15A:
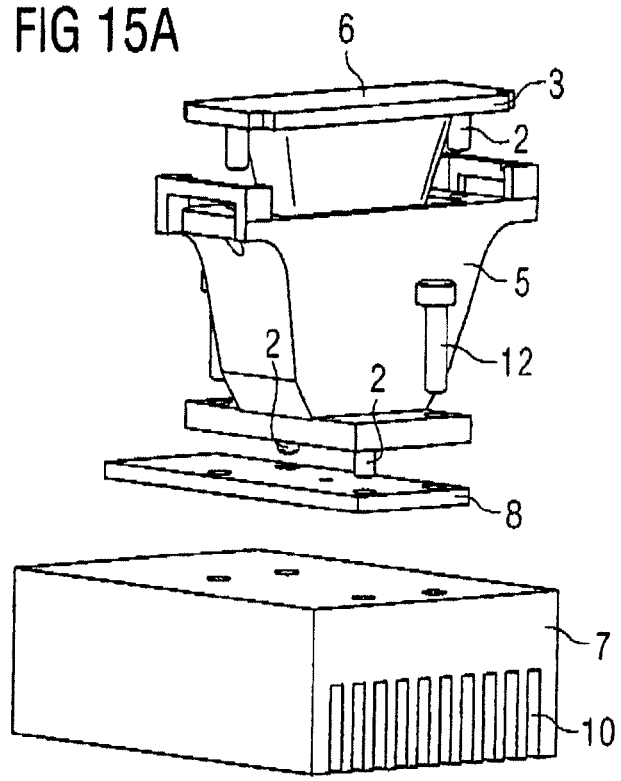
FIGS. 15a, 15b, 15c, 15d, 15e and 15f are schematic perspective representations of an exemplary embodiment of a light-emitting module with a multi-piece optical element comprising an optic body and a holder, said light-emitting module being disposed on a module holder in the form of a heat sink.
Figure 15B:
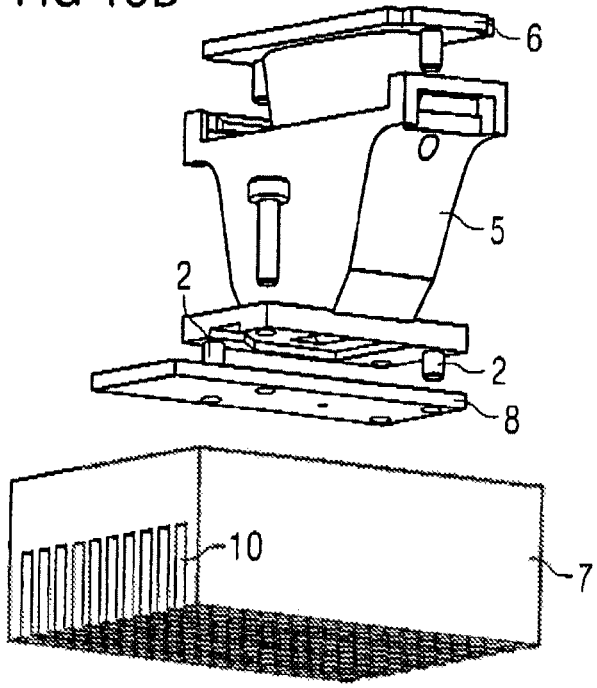
Figure 15C:
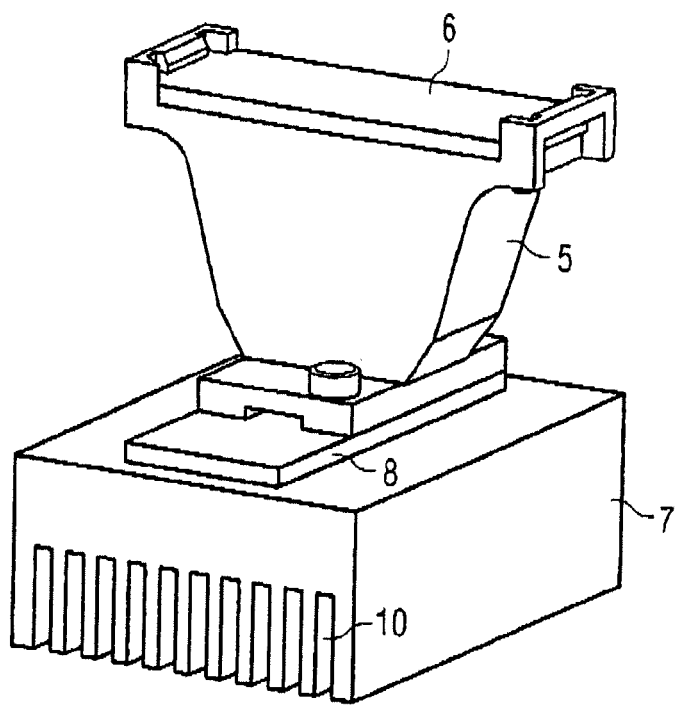
Figure 15D:
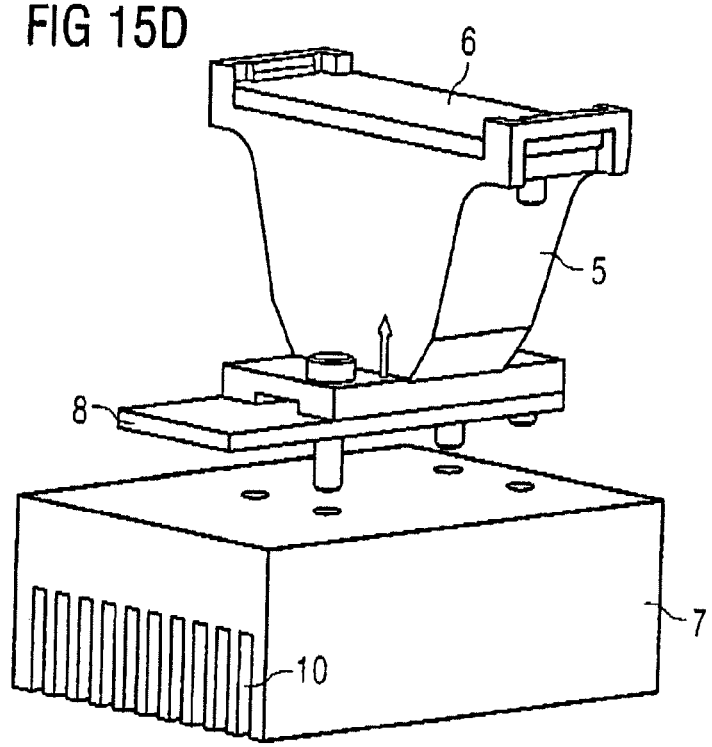
Figure 15E:
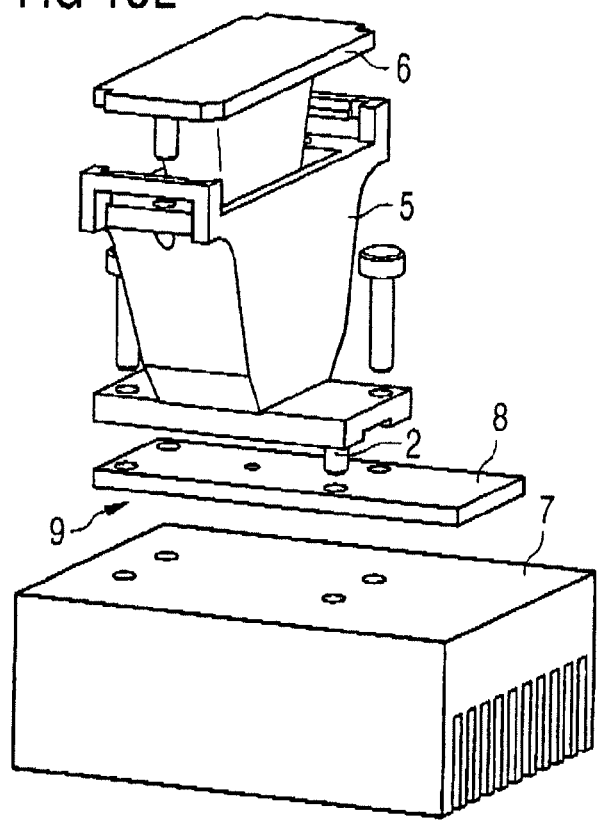
Figure 15F:
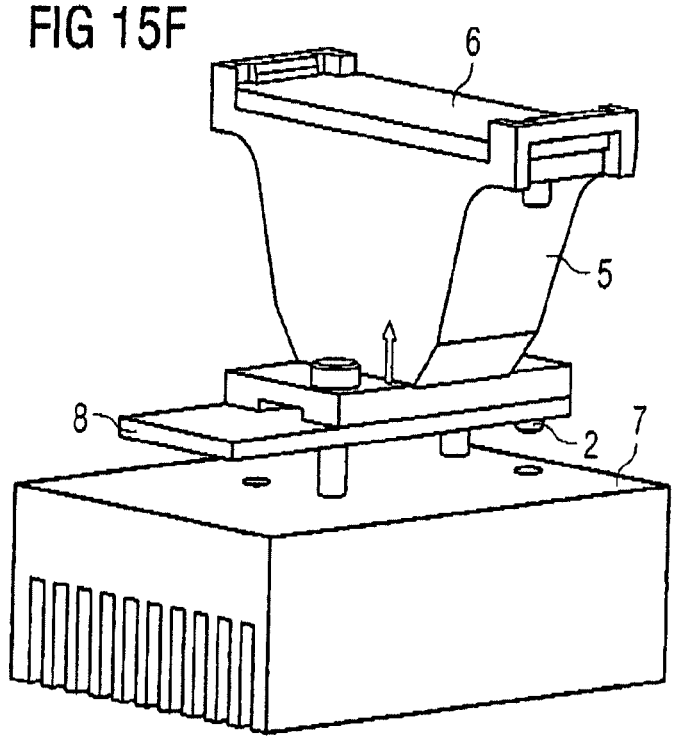
Figure 16D:
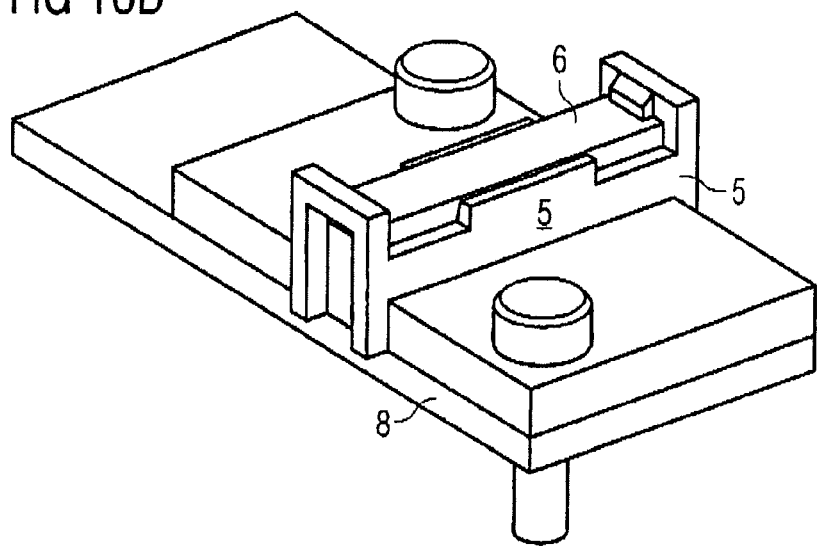
Figure 16E:
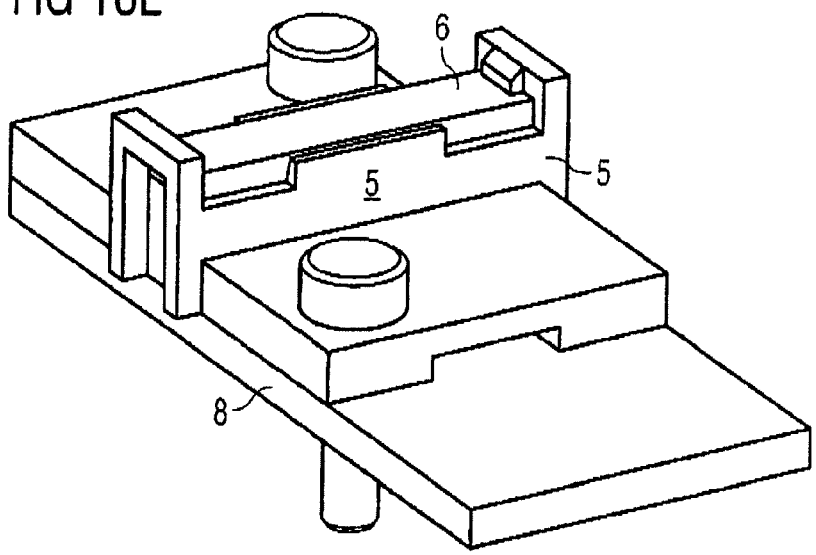

FIGS. 14a to 14c show schematic perspective representations, in different perspectives, of the optical element 1 of FIGS. 13a to 13f mounted on a carrier 8. It can be seen from FIGS. 14a and 14c that dowel pins 2 configured on the baseplate of holder 5 are pushed through corresponding recesses in the carrier 8 and protrude from the side of the carrier 8 facing away from the optical element 1. These dowel pins 2 can therefore be used to align and/or mount the module, composed of optical element 1 and carrier 8, on a module holder 7.

FIGS. 15a to 15f show schematic perspective representations of an exemplary embodiment of a light-emitting module comprising an optical element 1, mounted on a module holder 7.

Optical element 1 is, for example, a multi-piece optical element as described in connection with FIGS. 13 and 14. The module holder 7 in the exemplary embodiment of FIGS. 15a to 15f is configured as a heat sink comprising cooling fins 10. The mounting [sic] holder 7 is preferably formed of a material that is a good thermal conductor, such as a metal or a ceramic material, for example. As is apparent for example in connection with FIGS. 15a and 15b, the dowel pins 2 disposed on the baseplate of the holder 5 also serve to align the light-emitting module on the module holder 7. For this purpose, the dowel pins 2 engage in corresponding recesses in module holder 7. The module is mechanically attached to the module holder 7 for example by means of screws 12.

FIGS. 16a to 16e show schematic perspective representations of a further exemplary embodiment of a light-emitting module.

The module comprises an optic body 6 similar to the optic bodies illustrated in FIGS. 13a and 13b. (See also FIG. 16c.) In contrast to the optic body illustrated in FIGS. 13a and 13b, the optic body 6 of FIG. 16c is of smaller length. It is, for example, particularly suitable for producing a hotspot light distribution for the remote light from a motor vehicle projection lamp.

FIGS. 17a to 17f show further exemplary embodiments of an optical element 1. Optical element 1 comprises an optic body 6 configured similarly to the optic body 6 of FIGS. 13 to 16.

Figure 17A:
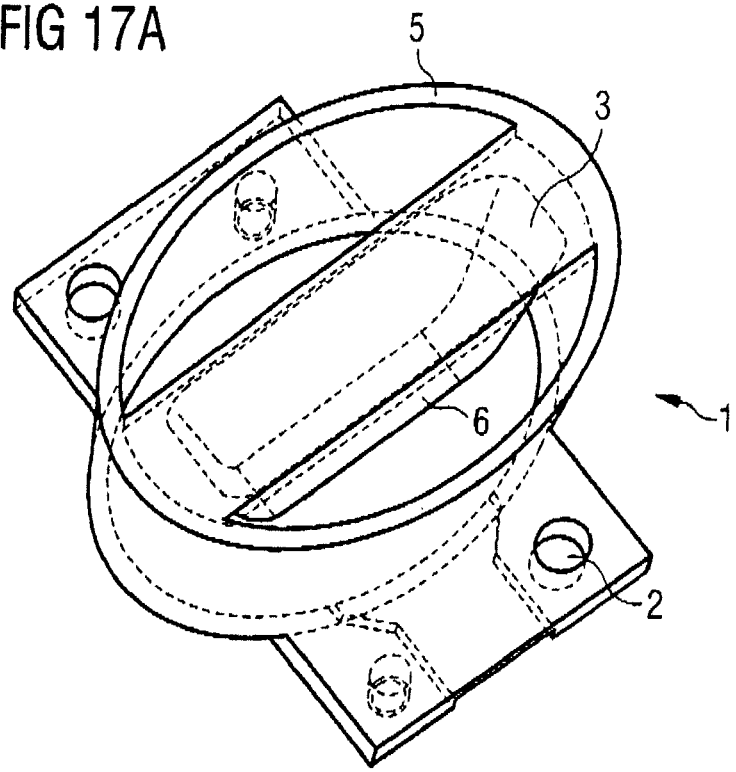
FIGS. 17a, 17b, 17c, 17d, 17e and 17f are schematic perspective representations of two variants of an exemplary embodiment of a preferably multi-piece optical element in the nature of an optical concentrator, with a frame-shaped holder comprising dowel pins formed onto it on the light exit side.
Figure 17B:
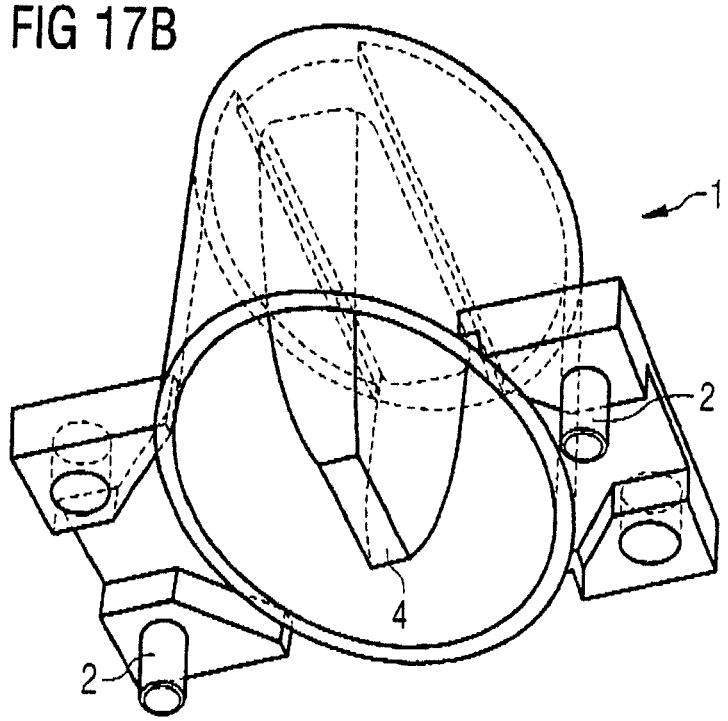
Figure 17C:
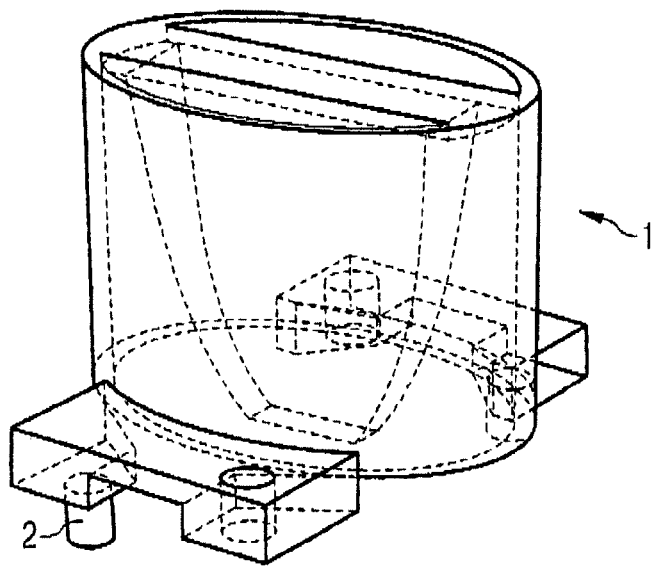
Figure 17D:
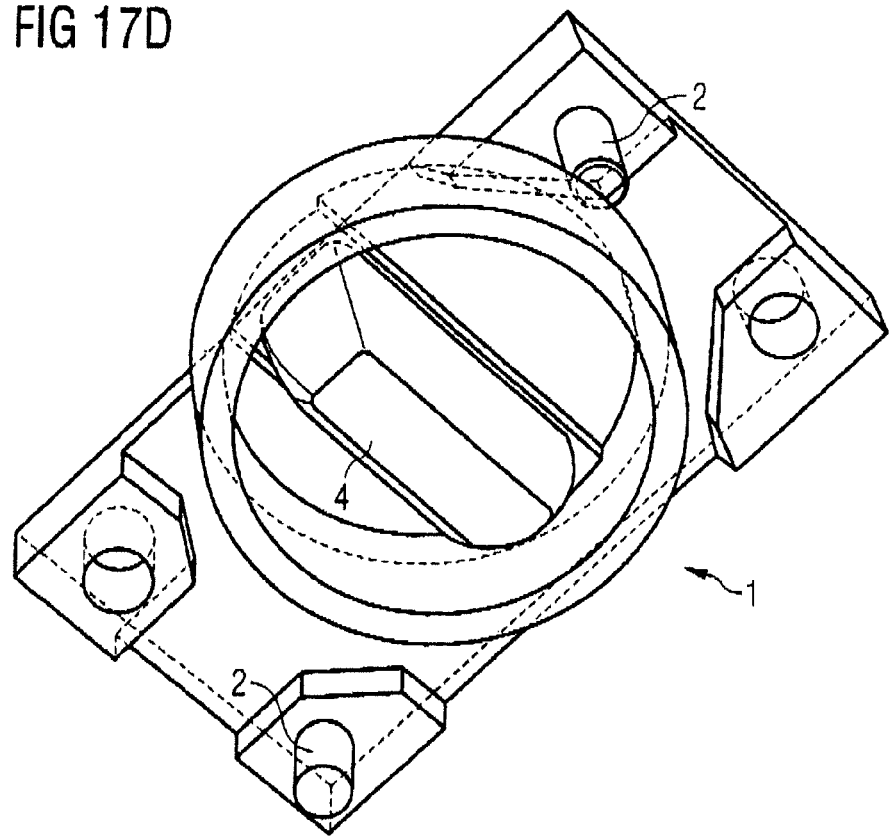
Figure 17E:
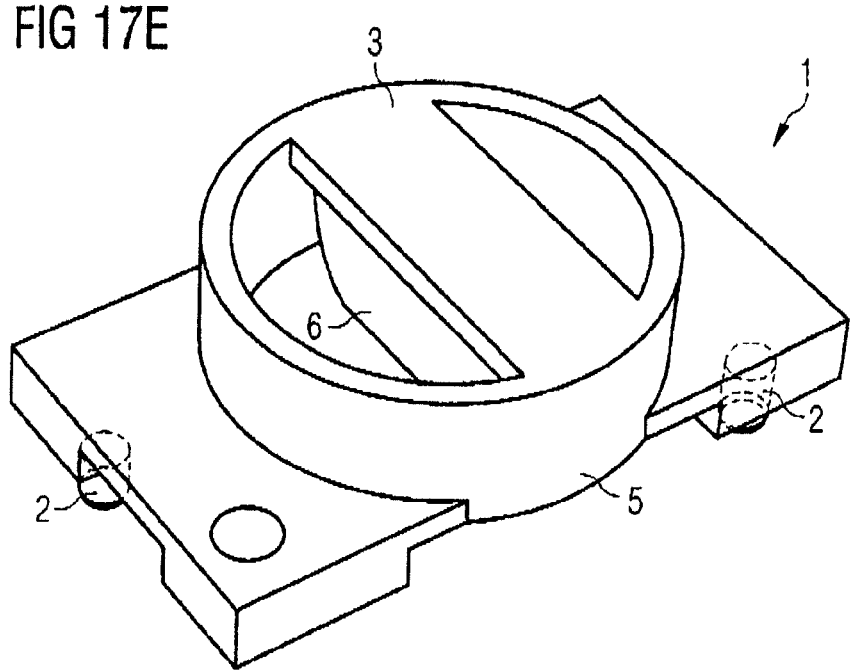
Figure 17F:
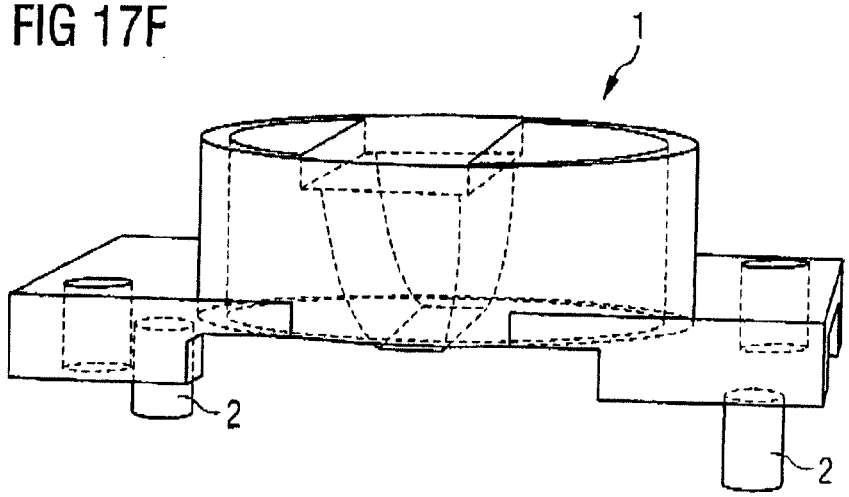

FIGS. 17a to 17d show an optic body 6 for a wide light distribution, and FIGS. 17e and 17f an optic body 6 for a hotspot distribution. Unlike the exemplary embodiments of FIGS. 13 to 16, the optical elements 1 of FIGS. 17a to 17f are configured in one piece. The optical element 1 is preferably fabricated in this case via an injection molding or a transfer molding process.

The optical element 1 is integrally connected in two places to a holder 5. Optical element 1 is preferably connected to holder 5 on the side thereof facing away from the carrier 8. The holder 5 is preferably implemented as at least locally curved. That is, the holder 5 has at least locally curved side walls. The holder 5 of FIGS. 17a to 17f has the shape of a hollow cylinder with an oval base area. The optical element 1 of FIGS. 17a to 17f makes use, inter alia, of the realization that this conformation for the holder 5 can compensate particularly well for thermal expansion of the optical element. Thus, when heated, the holder 5 expands for example away from the carrier 8, in a direction perpendicular to the baseplate of the optical element 1, which is attached to said carrier 8. The optic body 6, which is connected in two places to the holder 5, expands toward the carrier 8, in the direction of the baseplate. Due to the one-piece embodiment of the optical element 1, the optic body 6 and the holder 5 have the same thermal expansion coefficient, so the thermal expansions of the two elements balance each other out. This makes it possible to keep the distance between the LED chips 9 and the light entrance face 4 of the optic body 6 essentially constant even when the LED chips 9 are operating.

The curved shape of the holder 5 also operates to compensate for thermal stresses in the plane parallel to the carrier 8. Carrier 8 is, for example, a metal-core board, which expands more than the optical element 1 when heated. The at least locally curved holder 5 illustrated is suitable for compensating for stresses in the plane parallel to the carrier 8. In this way, the light entrance face 4 of the optical element 1 stays particularly exactly aligned with the LED chips 9 in this plane even when said LED chips 9 are operating.

The wall thickness of the side walls of the optical element 1 is, for example, between 1 and 3 mm, preferably between 1.3 and 1.7 mm. For example, the light entrance face 4 of the optical element 1 is in this case disposed after five LED chips 9 arranged along a straight line.

The optic body 6 of the exemplary embodiments of FIGS. 17a and 17e has a length of about 20 mm, for example. That is, the distance from the light entrance face 4 to the light exit face 3 is about 20 mm. The smaller diameter of the holder 5 at light exit face 3 is about 15 mm and the larger diameter is about 25 mm. The optical element 1 of FIGS. 17a to 17c is particularly well suited for forming a broad light distribution that can serve as the basic light distribution of a motor vehicle projection lamp.

The optic body 6 of the exemplary embodiments of FIGS. 17e and 17f has, for example, a distance from light entrance face 4 to light exit face 3 of about 10 mm. In the illustrated exemplary embodiments, the smaller diameter of the holder 5 at light exit face 3 is about 14 mm and the larger diameter is about 20 mm. The optical element 1 of FIGS. 17e and 17f is particularly well suited for forming a hotspot light distribution.

FIGS. 18a to 18d show a further exemplary embodiment of an optical element 1. In contrast to the optical elements 1 of FIGS. 17a to 17f, the holder of the optical element 1 of FIGS. 18a to 18d has locally planar lateral faces 11 that taper slightly in the direction of the light entrance opening 4 of the optic body 6. The planar lateral faces 11 simplify the production of the optical element 1 by injection molding. The planar lateral faces 11 further simplify the mounting of the optical element 1.

Said planar lateral faces 11 are joined to each other by curved lateral faces of the holder 5, which are shaped in plan for example in the manner of a circle or an ellipsis. As described above, the thus locally curved holder has proven particularly advantageous in compensating for thermal expansion during the operation of the LED chips 9.

Also in contrast to the exemplary embodiment of FIGS. 17a to 17f, the optical elements of FIGS. 18a to 18d comprise a dowel pin 2a that protrudes in two directions from the baseplate of the holder 5. This dowel pin 2a serves for example to align, relative to the light-emitting module, a secondary optic that can be disposed after the optical element 1 in the main emission direction of the LED chips 9.

Figure 18A:
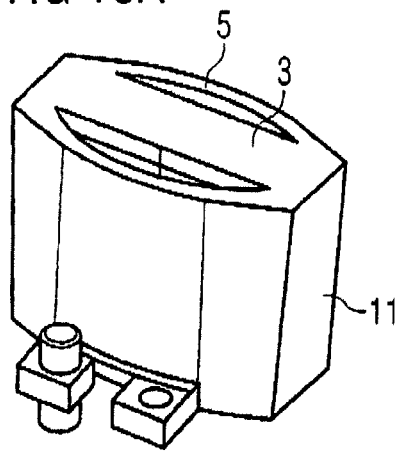
FIGS. 18a, 18b, 18c and 18d are schematic perspective representations of two variants of an exemplary embodiment of a preferably one-piece optical element in the nature of an optical concentrator, with a frame-shaped holder comprising dowel pins formed onto it on the light exit side.
Figure 18B:
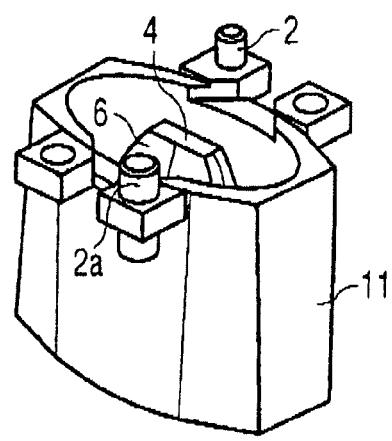

The optic body 6 of the exemplary embodiments of FIGS. 18a and 18b has for example a length of about 20 mm. That is, the distance from light entrance face 4 to light exit face 3 is about 20 mm. The smaller diameter of the holder 5 at light exit face 3 is about 15 mm and the larger diameter is about 25 mm. The optical element 1 of FIGS. 18a and 18b is particularly well suited for forming a broad light distribution that can serve as the basic light distribution of a motor vehicle projection lamp.

Figure 18C:
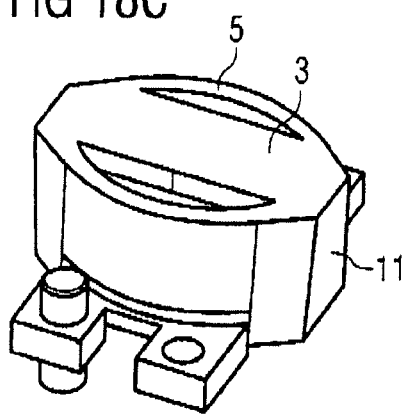
Figure 18D:
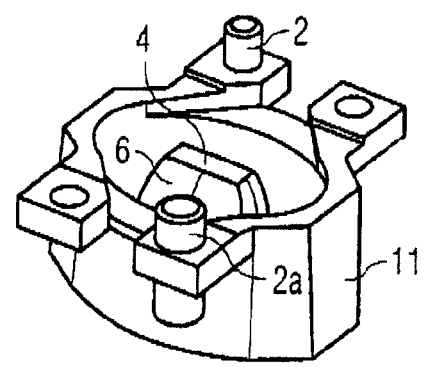

The optic body 6 of the exemplary embodiments of FIGS. 18c and 18d has, for example, a distance from light entrance face 4 to light exit face 3 of about 10 mm. The smaller diameter of the holder 5 at light exit face 3 in the illustrated exemplary embodiments is about 14 mm and the larger diameter is about 20 mm. The optical element 1 of FIGS. 18c and 18d is particularly well suited for forming a hotspot light distribution.

Figure 19A:
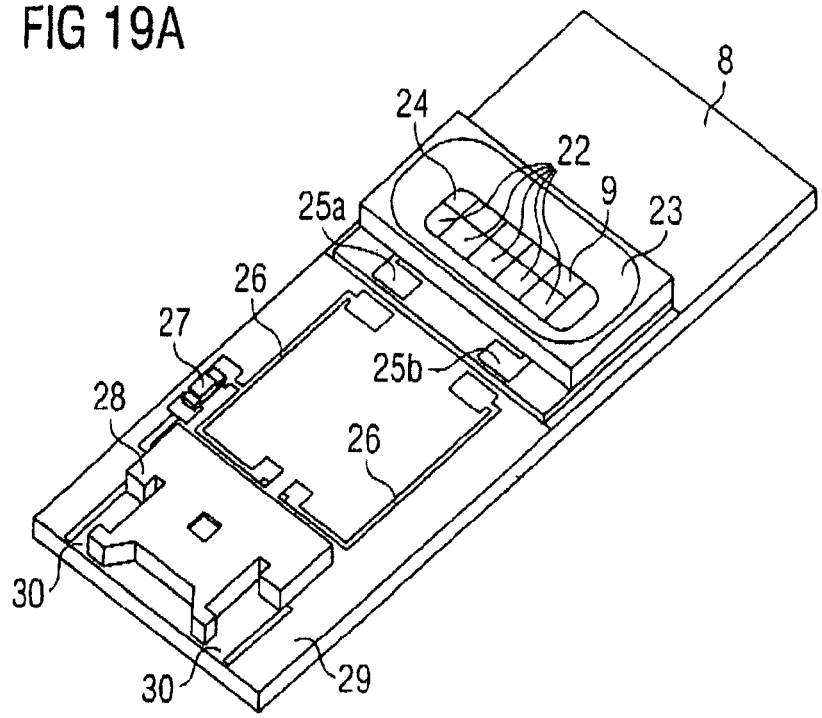
FIGS. 19a and 19b are schematic representations of a light-emitting module that includes a light source in the form of LED chips disposed on a carrier.
Figure 19B:
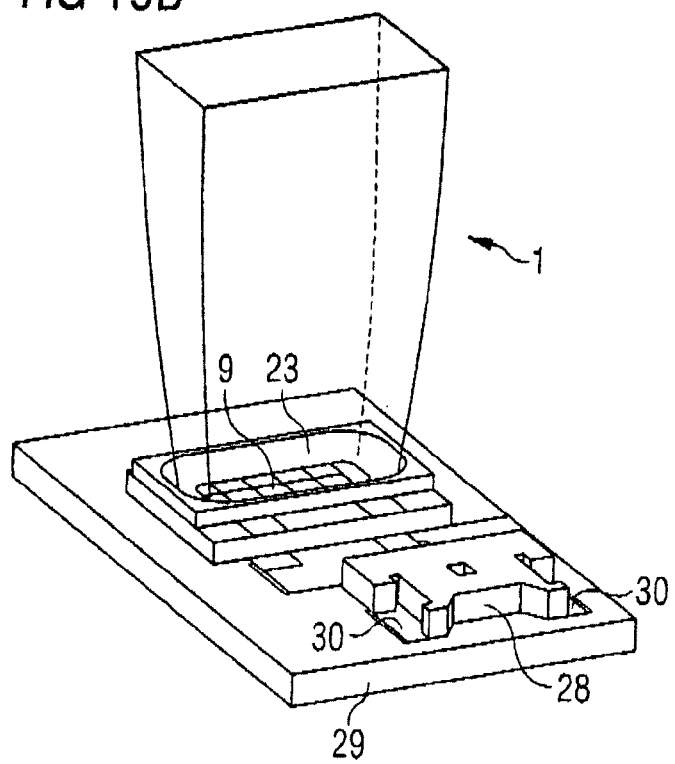

The light source 9 on carrier 8 as illustrated in FIGS. 19a and 19b includes, for example, five thin-film LED chips 22. Said LED chips 22 are, for example, thin-film LED chips each having a luminous efficiency of at least 20 lumens per watt. The LED chips 22 are preferably suitable for generating light in the blue region of the spectrum. A luminescence conversion material is then disposed after the LED chips 22. The frequency-converted portion of the radiation emitted by the LED chips 22 mixes with the non-converted portion preferably to yield white light.

The LED chips 22 are disposed on a carrier, for example on the floor 24 of a housing 23. The housing 23 can be formed for example of a ceramic material. The housing 23 preferably has inner walls that are configured as at least locally reflective.

The LED chips 22 are contacted outside the housing 23 at contact areas 25a and 25b. Conductive traces 26 connect the contact areas 25a, 25b to connection points 30, by means of which the light source 20 can be contacted from the outside. For example, the light source can be connected to the electric power system of a motor vehicle by joining a connector to mating connector 28. At least one varistor 27 functions as overvoltage protection for the light source 20. Mating connector 28, varistor 27 and housing 23 are arranged, for example, on a metal-core board 29 that functions both as a circuit board and as a heat-conducting element for the heat generated by the LED chips 22 during operation.

It is possible in this case to provide a device for dimming the LED chips 22 on the metal-core board 29 or outside the light-emitting module. In this way, the emission characteristic of the module can additionally be adapted, by varying the intensity, to external conditions such as weather or lighting conditions. It is also possible to vary the intensity of the light emitted by the light source by selectively turning individual LED chips 22 on and off.

This patent application claims the priorities of German Patent Applications 102005012486.0-11 and 102005033709.0-54, whose disclosure content is hereby incorporated by reference.

The invention is not limited by the description made with reference to the exemplary embodiments. Rather, the invention encompasses any novel feature and any combination of features, including in particular any combination of features recited in the claims, even if that feature or combination itself is not explicitly mentioned in the claims or exemplary embodiments.

The invention claimed is:

1. A light-emitting module comprising:
   a light source,
   a carrier for said light source,
   a first holder,
   a first optical element disposed on a side of said carrier opposite the first holder,
   wherein said first optical element comprises dowel pins that project through recesses defined by said carrier to engage corresponding recesses defined by said first holder to align said first optical element on said carrier and to align said first optical element and said carrier on said first holder, and
   a second optical element, wherein at least one of said dowel pins extends in the direction of said second optical element to engage a corresponding recess defined by said second optical element.

2. The light-emitting module as in claim 1, wherein said dowel pins mediate a mechanical connection between said first optical element and said carrier.

3. The light-emitting module as in claim 1, wherein said dowel pins mediate a mechanical connection between said first optical element and said carrier and said first holder.

4. The light-emitting module as in claim 1, wherein said at least one of said dowel pins mechanically connects said second optical element to said first optical element.

5. The light-emitting module as in claim 1, wherein said dowel pins are configured as star-shaped in cross section.

6. The light-emitting module as in claim 1, wherein the diameter of said dowel pins varies along said dowel pins.

7. The light-emitting module as in claim 1, wherein a reservoir for receiving an adhesive is disposed around at least one dowel pin.

8. The light-emitting module as in claim 1, wherein said first optical element includes a second holder and an optic body.

9. The light-emitting module as in claim 8, wherein said optic body is configured as an optical concentrator that tapers toward said light source.

10. The light-emitting module as in claim 8, wherein said optic body is configured as a solid body.

11. The light-emitting module as in claim 10, wherein said optic body contains one of the following materials: PMMA, PMMI, PC, Makrolon, APEC, COC.

12. The light-emitting module as in claim 8, wherein said second holder laterally embraces said optic body.

13. The light-emitting module as in claim 8, wherein said second holder has locally curved lateral faces.

14. The light-emitting module as in claim 8,
wherein said second holder is configured at least locally in the manner of a hollow cylinder that laterally embraces said optic body.

15. The light-emitting module as in claim 1,
wherein said first optical element includes a second holder and an optic body, said second holder surrounding said light source on at least four sides.

16. The light-emitting module as in claim 1,
wherein said first optical element embraces said light source on at least four sides.

17. The light-emitting module as in claim 1,
wherein said first optical element is configured in one piece.

18. The light-emitting module as in claim 1,
wherein said first optical element is configured in more than one piece.

19. The light-emitting module as in claim 1,
wherein said light source includes at least one LED chip.

20. The light-emitting module as in claim 19,
wherein said LED chip is free of potting compound.

21. The light-emitting module as in claim 19,
wherein a gap containing air is disposed between said LED chip of said light source and a light entrance face of said first optical element.

22. The light-emitting module as in claim 19,
wherein said first optical element has an area of contact with an encapsulant of a said LED chip.

23. The light-emitting module as in claim 19,
wherein the distance between said LED chip and said light entrance face of said first optical element is no more than 250 μm.

* * * * *

UNITED STATES PATENT AND TRADEMARK OFFICE
CERTIFICATE OF CORRECTION

PATENT NO. : 7,621,658 B2  Page 1 of 1
APPLICATION NO. : 11/853129
DATED : November 24, 2009
INVENTOR(S) : Stefan Grötsch et al.

It is certified that error appears in the above-identified patent and that said Letters Patent is hereby corrected as shown below:

Title Page; item (75); FIRST PAGE, Inventors, column 1, line 3, delete "Regensberg (DE)" and insert -- Rattenberg (AT) --.

Signed and Sealed this

Fifth Day of January, 2010

David J. Kappos
*Director of the United States Patent and Trademark Office*